(12) United States Patent
Safi-Harab et al.

(10) Patent No.: US 12,107,596 B2
(45) Date of Patent: Oct. 1, 2024

(54) SUCCESSIVE APPROXIMATION REGISTER BASED TIME-TO-DIGITAL CONVERTER USING A TIME DIFFERENCE AMPLIFIER

(71) Applicant: Ciena Corporation, Hanover, MD (US)

(72) Inventors: Mouna Safi-Harab, Montreal (CA); Soheyl Ziabakhsh Shalmani, Kanata (CA); Sadok Aouini, Gatineau (CA); Naim Ben-Hamida, Nepean (CA)

(73) Assignee: Ciena Corporation, Hanover, MD (US)

( * ) Notice: Subject to any disclaimer, the term of this patent is extended or adjusted under 35 U.S.C. 154(b) by 228 days.

(21) Appl. No.: 17/961,845

(22) Filed: Oct. 7, 2022

(65) Prior Publication Data

US 2024/0120935 A1 Apr. 11, 2024

(51) Int. Cl.
*H03M 1/10* (2006.01)
*H03M 1/16* (2006.01)
(Continued)

(52) U.S. Cl.
CPC ............. *H03M 1/462* (2013.01); *H03M 1/16* (2013.01); *H03M 1/504* (2013.01)

(58) Field of Classification Search
CPC .. H03M 1/502; H03M 1/1215; H03M 1/1245; H03M 1/14; H03M 1/38; H03M 1/50; H03M 1/60; H03M 1/00; H03M 1/0619; H03M 1/0621; H03M 1/0626; H03M 1/0695; H03M 1/0836; H03M 1/10; H03M 1/1009; H03M 1/1014; H03M 1/1023; H03M 1/12; H03M 1/1205;
(Continued)

(56) References Cited

U.S. PATENT DOCUMENTS 6,963,733 B2 * 11/2005 Eriksson .................. H03G 1/04
455/132
8,957,712 B2 * 2/2015 Tang ..................... H03L 7/0991
327/159
(Continued)

OTHER PUBLICATIONS

X. Geng et al., "A 25.8GHz Integer-N PLL with Time-Amplifying Phase-Frequency Detector Achieving 60fsrms Jitter, -252.8dB FoMj, and Robust Lock Acquisition Performance," ISSCC, pp. 389-390, Feb. 2022.
(Continued)

*Primary Examiner* — Linh V Nguyen
(74) *Attorney, Agent, or Firm* — Young Basile Hanlon & MacFarlane, P.C.

(57) ABSTRACT

A successive approximation register based time-to-digital converter circuit with a time difference amplifier (TDA). A first TDA which applies a gain value to a time difference between a first signal edge and a first delayed signal edge to generate a first amplified time difference signal, which is feedback to the first TDA, a second TDA which applies a gain value to a time difference between a second signal edge and a second delayed signal edge to generate a second amplified time difference signal, which is feedback to the second TDA, and a finite state machine which sets another gain value, for a next step in a N step conversion until N steps are completed, in the first and the second TDAs based on a bit value from a previous step, wherein the bit value indicates, for a step, whether the first or second amplified time difference signal is ahead.

20 Claims, 15 Drawing Sheets

(51) Int. Cl.
*H03M 1/46* (2006.01)
*H03M 1/50* (2006.01)

(58) Field of Classification Search
CPC ........ H03M 1/187; H03M 1/188; H03M 1/20;
H03M 1/468; H03M 1/56; H03M 3/378;
H03M 3/424; H03M 3/488; G04F 10/005;
G04F 5/10; H03L 7/081; H03L 2207/50;
H03L 7/085; H03L 7/0991; H03L 7/1976;
H03L 7/00; H03L 7/08; H03L 7/0814;
H03L 7/091; H03L 7/093; H03L 7/099;
H03L 7/18; H03L 7/183
USPC .................................. 341/118–121, 155, 159
See application file for complete search history.

(56) References Cited

U.S. PATENT DOCUMENTS

| | | | | |
|---|---|---|---|---|
| 9,071,304 | B2* | 6/2015 | Banin | H03F 3/24 |
| 9,698,807 | B1* | 7/2017 | Caffee | H03M 1/1033 |
| 9,941,898 | B1* | 4/2018 | Banin | H03M 1/82 |
| 10,895,850 | B1* | 1/2021 | Elkholy | G04F 10/005 |
| 2014/0015703 | A1* | 1/2014 | Pullela | H04B 17/24 |
| | | | | 341/166 |
| 2016/0352350 | A1* | 12/2016 | Tanizawa | H03M 1/1205 |
| 2021/0359696 | A1* | 11/2021 | Shalmani | H03M 1/125 |
| 2023/0253976 | A1* | 8/2023 | Whitcombe | G04F 10/005 |
| | | | | 341/120 |
| 2023/0387943 | A1* | 11/2023 | Laughlin | H04B 1/44 |

OTHER PUBLICATIONS

Christopher Taillefer, "Analog-to-Digital Conversion via Time-Mode Signal Processing," McGill University, Department of Electrical and Computer Engineering, Aug. 2007.

S. Ziabakhsh et al., "An All-Digital High-Resolution Programmable Time-Difference Amplifier Based on Time Latch" IEEE International Symposium on Circuits and Systems, 2018, pp. 1-5, doi: 10.1109/ISCAS.2018.8351369.

M. Ali-Bakhshian and G. W. Roberts, "A Digital Implementation of a Dual-Path Time-to-Time Integrator," IEEE Transactions on Circuits and Systems I, Regular Papers, vol. 59, No. 11. pp. 2578-2591, Nov. 2012, doi: 10.1109/TCSI.2012.2190669.

A. Mantyniemi et al., "A CMOS Time-to-Digital Converter (TDC) Based on a Cyclic Time Domain Successive Approximation Interpolation Method", IEEE Journal of Solid-State Circuits, vol. 44, No. 11, pp. 3067-3078, Nov. 2009, doi: 10.1109/JSSC.2009.2032260.

J. Szyduczynski et al. "A Successive Approximation Time-to-Digital Converter with Single Set of Delay Lines for Time Interval Measurements", Sensors, vol. 19, 1109, pp. 1-27, Mar. 5, 2019, doi: 10.3390/s19051109.

Y. S. Shu, "Noise-Shaping SAR ADCs," IEEE International Solid-State Circuits Conference, pp. 1-86, Feb. 20, 2022.

B. Murmann, "Introduction to ADCs/DACs: Metrics, Topologies, Trade Space, and Applications," IEEE International Solid-State Circuits Conference, pp. 1-93, Feb. 2022.

* cited by examiner

SUCCESSIVE APPROXIMATION REGISTER BASED TIME-TO-DIGITAL CONVERTER USING A TIME DIFFERENCE AMPLIFIER

TECHNICAL FIELD

This disclosure relates to analog to digital converter circuits. More specifically, this disclosure relates to successive approximation register based time-to-digital converter circuits which use a time difference amplifier.

BACKGROUND

Successive-approximation-register (SAR)-based analog-to-digital converters (SAR-ADCs) are widely adopted architectures for analog voltages and time and/or phase difference digitization. This mainly stems from SAR-ADCs' low-power and simple low complexity circuit architecture. In serializer/deserializer (SerDes) applications, SAR-ADCs are often the architecture of choice for analog signal conversion in receiver paths due to SAR-ADCs' good speed-complexity-power trade-off and its ease of interleaving. SARs, in pipeline or a hybrid model, can be combined with time interleaving to achieve a desired speed and/or resolution, while remaining within an overall allocated power. In the lower speed counterparts, such as for biomedical sensing, SAR ADCs have been the architecture of choice to combine with feedback loop sigma-delta modulators to increase the overall figure of merit (FoM), which reflects the performance or efficiency of a given device. In other words, in either low- or high-speed applications, SAR-based converters have been the go-to architecture in hybrid model converters and the enabling piece to allow voltage mode converters push the envelope of performance.

Quantizing a phase difference between two digital clock edges by using a SAR algorithm, i.e., SAR-based time-to-digital converters (SAR-based TDCs), are also commonly used in many applications, such as pulsed radar systems for example. Like in the case of their voltage quantization counterpart, SAR-based TDCs are preferred over their flash architectures due to their relaxed number of stages required (N instead of $2^N$), and to their feedback-based oversampled counterparts (sigma-delta) due to their increased Nyquist bandwidth.

Another class of voltage converters is the time-mode signal processing ADCs which contain a front-end voltage-to-time converter (VTC) unit followed by time-mode signal processing units. The advantage of such converters lies in their ability to process time using digital circuits. This can promise area and power scaling with technology shrinking without the voltage overhead constraints imposed by the shrinking supply voltage. In fact, just like hybrid architectures are now commonly used for achieving high FoMs, voltage mode ADCs, and hybrid voltage-time ADCs have also been achieving promising FoMs. With the emerging class of hybrid voltage-time mode converters, the distinction between quantizing voltage and time become more and more faded.

Irrespective of the application intended (low vs. high speed) or quantity manipulated and processed during quantization (voltage vs. time), there is a continuous need for implementing new and efficient SAR converters and algorithms. At the heart of any SAR algorithm circuit implementation, a binary weighting element to perform the binary search is required. In the voltage domain, those are commonly implemented using a binary weighted capacitor bank in a capacitor-based digital-to-analog converter (DAC). This binary weighting allows to always add or subtract a half-range to the previous comparison level. Usually, the conversion is performed in as many stages or steps or clock cycles as the overall number of bit resolution the SAR converter is required to achieve. Practically, a few clock cycles are usually added as overhead time. The binary weighted implementation of capacitor-based DAC results in design constraints and trade-offs, such as consuming more than 50% of chip footprint, having issue in matching the capacitors, consuming power, and designing switches with different drive capability.

SAR algorithms for phase difference measurements fall into two general categories: feedforward and feedback. In the former, the time difference is moved forward through a chain of delay stages with number of stages and phase/time comparators needed equal to N where N is the bit resolution sought, and in the latter, one stage with one comparator is used with output fed back, but with a DAC needed (i.e., going back to the analog domain to perform this feedback operation). In feedforward architectures, N binary weighted delay stages are used to perform the conversion in N steps, achieving a resolution of N bits. In feedback structures, the same feedback unit is used, but the output time difference of each conversion step is fed back through a DAC with a binary weighted capacitor bank. In the latter, the analog voltage is used as an intermediate domain for the binary weighting.

In either of the two broad categories, a binary weighted element of choice is needed: a binary weighted delay gate in the former and a binary weighted capacitor bank to implement the feedback DAC in the latter. These are necessary to perform the binary search that the SAR algorithm needs to implement. FIG. 11 shows a block diagram representation of a top-level layout of an ADC, where each block is representative of an area needed on a chip. As illustrated, a large area is occupied by the capacitor banks.

Besides the area required for the capacitors, another concern in implemented conventional voltage-mode SAR ADC design is the high level of matching in the capacitor-based DAC in order to provide the promising results. FIG. 12 is an example capacitor layout floorplan for a SAR-ADC for achieving high capacitor array matching.

Finally, the drive capability of the switches is yet another concern to account for in SAR-ADCs. For capacitors on the least significant bit (LSB) side, a simple switch can be used to charge/discharge the capacitors. However, on the most significant bit (MSB) side a strong switch is needed to have the proper drive capability during the charge/discharge process as many unit capacitors are being driven at the same time.

In both cases or categories outlined above, matching an array of elements with sizing spread that spans a range of $1:2^{N-1}$ (where N is the bit-resolution of the TDC and/or ADC) can be chip area consuming and challenging from a matching perspective.

In addition, in asynchronous SAR ADCs, the settling time of the internal capacitor-based DAC inside the SAR ADC limits the overall conversion speed. Using large switches for MSB capacitors, complicated finite state machine (FSM), and using large area are other limitations.

SUMMARY

Described herein are apparatus and methods for successive approximation register based time-to-digital converter circuits which use a time difference amplifier.

In implementations, a N-bit successive approximation register based time-to-digital converter includes a first delay circuit configured to delay a first input signal to generate a delayed first input signal, a second delay circuit configured to delay a second input signal to generate a delayed second input signal, a first programmable time difference amplifier configured to apply a gain value to the delay between the first input signal and the delayed first input signal to generate an amplified delayed first input signal, which is feedback to the first delay circuit and the first programmable time difference amplifier, a second programmable time difference amplifier configured to apply a gain value to the delay between the second input signal and the delayed second input signal to generate an amplified delayed second input signal, which is feedback to the second delay circuit and the second programmable time difference amplifier, a comparator configured to determine a bit value for a step in a N step conversion, the bit value based on which of the amplified delayed first input signal and the amplified delayed second input signal is in leading position, a finite state machine configured to set another gain value, for a next step in the N step conversion, in the first programmable time difference amplifier based on the determined bit value in a previous step and set another gain value in the second programmable time difference amplifier based on the determined bit value in the previous step and the N-bit successive approximation register based time-to-digital converter configured to determine a bit value for each step in the N step conversion and output a digital result based on each determined bit value in the N step conversion.

In some implementations, the first input signal and the second input signal are time domain signals. In some implementations, the circuit further comprising a voltage-to-time converter configured to convert a first voltage input signal and a second voltage input signal to the first input signal and the second input signal. In some implementations, each gain value in the first programmable time difference amplifier and each gain value in the second programmable time difference amplifier are binary weighted gain values. In some implementations, each gain value set for each step in the N step conversion for the first programmable time difference amplifier is different from each gain value set for each step in the N step conversion for the second programmable time difference amplifier. In some implementations, the N-bit successive approximation register based time-to-digital converter configured to operate in a looping configuration, wherein multiple loops are made using a current gain value setting to meet a desired gain value in a step. In some implementations, the finite state machine is further configured to forego setting the another gain value in the first programmable time difference amplifier and the another gain value in the second programmable time difference amplifier until the N-bit successive approximation register based time-to-digital converter completes a defined number of loops to meet a desired gain value in a step. In some implementations, each of the first programmable time difference amplifier and the second programmable time difference amplifier further comprise a two-stage time latch. In some implementations, each of the first programmable time difference amplifier and the second programmable time difference amplifier further comprise a first time latch, a second time latch connected to the first time latch, a gain logic circuit connected to the first time latch and the second time latch, and a digital gain controller connected to the first time latch and the second time latch, the digital gain controller configured to configure the first time latch, the second time latch, and the gain logic circuit to generate an amplified delayed input signal based on control information received from the finite state machine. In some implementations, each of the first programmable time difference amplifier and the second programmable time difference amplifier further comprise a skew circuit configured to maintain a constant skew for each gain value.

In implementations, a circuit includes a first variable gain time difference amplifier configured to apply a gain value to a time difference between a first signal edge and a first delayed signal edge to generate a first amplified time difference signal, which is feedback to the first variable gain time difference amplifier, a second variable gain time difference amplifier configured to apply a gain value to a time difference between a second signal edge and a second delayed signal edge to generate a second amplified time difference signal, which is feedback to the second variable gain time difference amplifier, and a finite state machine configured to set another gain value, for a next step in a N step conversion until N steps are completed, in the first variable gain time difference amplifier based on a bit value from a previous step and set another gain value in the second variable gain time difference amplifier based on the bit value from the previous step, wherein the bit value indicates, for a step in the N step conversion, which of the first amplified time difference signal and the second amplified time difference signal is ahead.

In some implementations, the circuit further comprising a phase comparator configured to determine each bit value for each step in the N step conversion. In some implementations, each gain value in the first variable gain time difference amplifier and each gain value in the second variable gain time difference amplifier are binary weighted gain values. In some implementations, each gain value set for each step in the N step conversion for the first variable gain time difference amplifier is different from each gain value set for each step in the N step conversion for the second variable gain time difference amplifier. In some implementations, the finite state machine is further configured to forego setting the another gain value in the first variable gain time difference amplifier and the another gain value in the second variable gain time difference amplifier until a defined number of loops is completed to meet a desired gain value in a step. In some implementations, each of the first variable gain time difference amplifier and the second variable gain time difference amplifier further comprise a two-stage time latch. In some implementations, each of the first variable gain time difference amplifier and the second variable gain time difference amplifier further comprise a first time latch, a second time latch connected to the first time latch, a gain logic circuit connected to the first time latch and the second time latch, and a digital gain controller connected to the first time latch and the second time latch, the digital gain controller configured to configure the first time latch, the second time latch, and the gain logic circuit to generate a desired gain value and an amplified time difference signal based on control information received from the finite state machine. In some implementations, each of the first variable gain time difference amplifier and the second variable gain time difference amplifier further comprise a skew logic circuit configured to maintain a constant skew for each desired gain value.

In implementations, a method includes applying, by a first variable gain time difference amplifier, a gain value to a time difference between a first signal edge and a first delayed signal edge to generate a first amplified time difference signal, which is feedback to the first variable gain time difference amplifier, applying, by a second variable gain time difference amplifier, a gain value to a time difference between a second signal edge and a second delayed signal edge to generate a second amplified time difference signal, which is feedback to the second variable gain time difference amplifier, and setting, by a finite state machine, another gain value, for a next step in a N step conversion until N steps are completed, in the first variable gain time difference amplifier based on a bit value from a previous step and another gain value in the second variable gain time difference amplifier based on the bit value from the previous step, wherein the bit value indicates, for a step in the N step conversion, which of the first amplified time difference signal and the second amplified time difference signal is ahead.

In some implementations, the method further comprising foregoing, by the finite state machine, the setting until a defined number of loops is completed to meet a desired gain value in a step.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
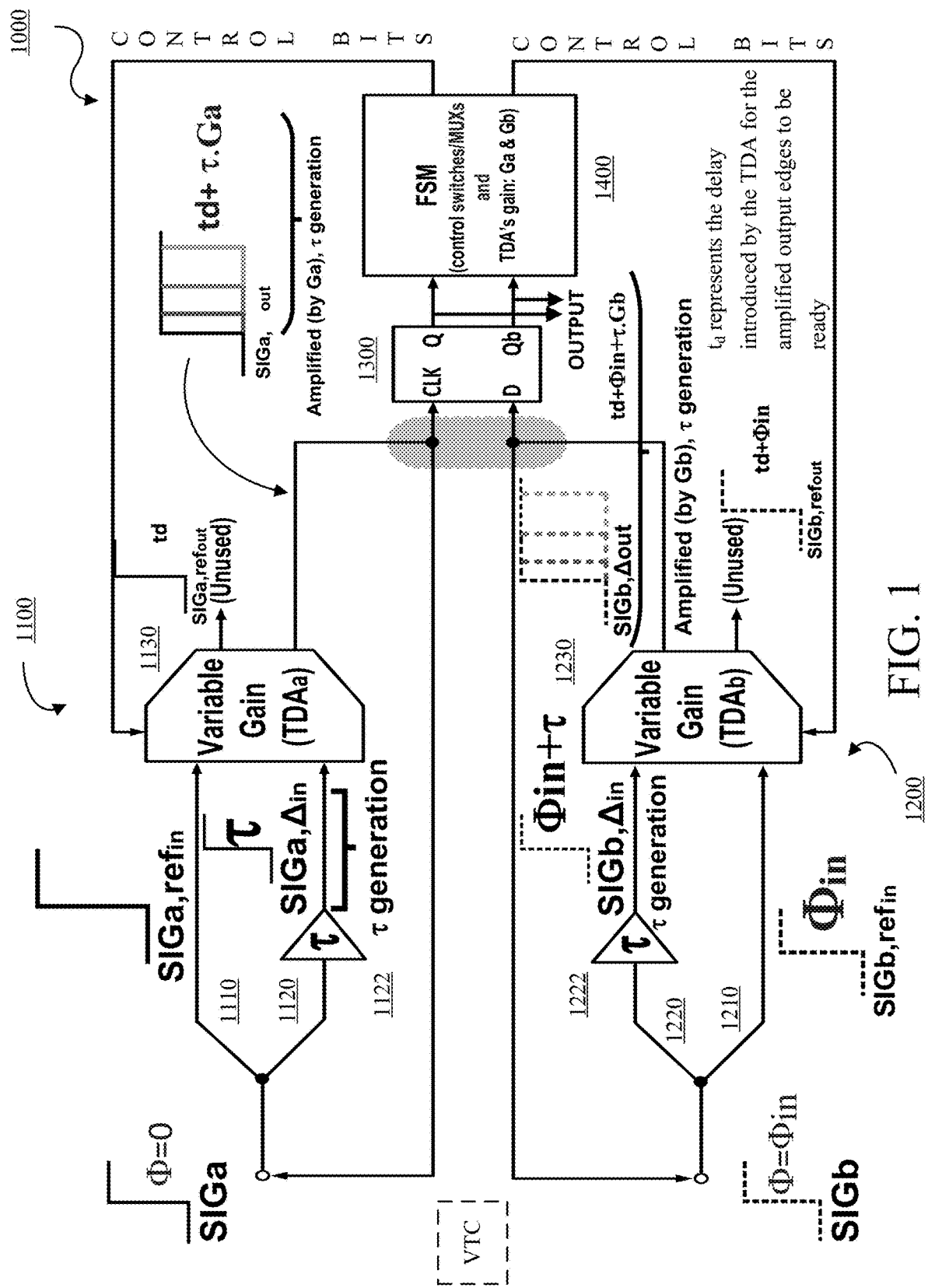
FIG. 1 is a block diagram of an example of a SAR-based TDC in accordance with implementations of this disclosure.

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "computer" or "computing device" includes any unit, or combination of units, capable of performing any method, or any portion or portions thereof, disclosed herein. The computer or computing device may include a processor.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

As used herein, the terminology "memory" indicates any computer-usable or computer-readable medium or device that can tangibly contain, store, communicate, or transport any signal or information that may be used by or in connection with any processor. For example, a memory may be one or more read-only memories (ROM), one or more random access memories (RAM), one or more registers, low power double data rate (LPDDR) memories, one or more cache memories, one or more semiconductor memory devices, one or more magnetic media, one or more optical media, one or more magneto-optical media, or any combination thereof.

As used herein, the terminology "instructions" may include directions or expressions for performing any method, or any portion or portions thereof, disclosed herein, and may be realized in hardware, software, or any combination thereof. For example, instructions may be implemented as information, such as a computer program, stored in memory that may be executed by a processor to perform any of the respective methods, algorithms, aspects, or combinations thereof, as described herein. Instructions, or a portion thereof, may be implemented as a special purpose processor, or circuitry, that may include specialized hardware for carrying out any of the methods, algorithms, aspects, or combinations thereof, as described herein. In some implementations, portions of the instructions may be distributed across multiple processors on a single device, on multiple devices, which may communicate directly or across a network such as a local area network, a wide area network, the Internet, or a combination thereof.

As used herein, the term "application" refers generally to a unit of executable software that implements or performs one or more functions, tasks or activities. The unit of executable software generally runs in a predetermined environment and/or a processor.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

Described herein are apparatus, devices, circuits, systems, and methods for successive approximation register based time-to-digital converter circuits (SAR-based TDCs) which use a time difference amplifier (TDA). The described circuits provide a SAR-based TDC configuration with time-mode or time-domain signal processing that does not require a large area for a capacitor array, big switches, nor a complicated finite state machine (FSM). The described circuits and methods can provide efficiency in terms of area and power consumption with performance metrics matching or nearly matching standard designs in terms of bit-resolution, signal to noise and dispersion ratio (SNDR), speed, and other metrics with the sample-and-hold and the front-end voltage-to-time converter (VTC) being the only analog components in this design.

In implementations, the SAR-based TDC is a purely time-mode implementation of a SAR algorithm in the context of time-difference processing. The SAR-based TDC uses an all-digital TDA with an ability to be programmed digitally to provide different gains based on different switching arrangements. The programmable gains of the TDA are selected appropriately to provide the desired binary weighting gain. This binary weighting is achieved through digitally controlled switches; hence no capacitor matching requirement is necessary. The TDA relies on time latches or time domain memory elements. In some implementations, the time latches can have a capacitor for charge transfer (charging/discharging) in the front-end voltage-controlled delay unit (VCDU). While capacitor linearity is important, the capacitors are not required to be matched to any other element in the design. In some implementations, capacitors can be removed altogether for high-speed applications, if needed/desired, as shown in C. Taillefer, "Analog-to-Digital Conversion via Time-Mode Signal Processing," Ph.D. dissertation, McGill University, Montreal, August 2007, and X. Geng, Y. Tian, Y. Xiao, Z. Ye, Q. Xie, Z. Wang, "A 25.8 GHz Integer-N PLL with Time Amplifying Phase-Frequency Detector Achieving 60 fsrms Jitter, -252.8 dB FoM J and Robust Lock Acquisition Performance," ISSCC 2022, the contents of which are both incorporated by reference as if stated fully herein.

In implementations, the SAR-based TDC can process phase differences in the time domain by time delaying an input time-difference using binary weighted modes with respect to a reference clock. The binary weighted modes can be implemented using TDAs, which use time latches. The capacitors/capacitance needed in the time latches of the TDA can be implemented using parasitic capacitor or capacitance, where matching between the capacitors/capacitance can be more easily achieved (relative to capacitor array matching) by appropriate transistor sizing.

In implementations, the binary weighting is implemented using a gain of the TDA. In some implementations, the TDA can have a capacitor as a medium for charge transfer. However, the exact value of the capacitor is not central to the proper operation of the binary weighting factor and the capacitor value is not to be matched to any other component in the implementation. The TDA capacitor is only used as an internal storage element for charging/discharging during gain amplification.

In implementations, the input/output signals present at the main building blocks of the circuit, which are transferring the encoded information, are always working with digital edges. As such, the chip area is very small, the design is robust to process, voltage, and temperature (PVT) variations, and consumes mostly dynamic rather than static power.

In implementations, SAR-based TDC is an all-digital implementation and a real time-mode processing of the SAR algorithm, which is readily applicable for phase difference measurements. In implementations, SAR-based TDC can be combined with a front-end VTC (which in this instance would be the only analog required component). This implementation enables an efficient SAR ADC implementation, without the limitations of area, matching, and settling time a capacitor-bank-based DAC implementation of a SAR ADC would require.

In implementations, the binary weighted capacitor bank used in other SAR ADC implementations is replaced with a TDA. In implementations, the SAR-based TDC is a time-mode implementation of the SAR algorithm using a TDA to provide a digitally controlled binary weighted gain, and a single delay unit equivalent to an LSB. The linearity of the TDA is directly related to the number of time latches used. The higher the number of stages, the less linear the TDA becomes. In some implementations, higher gains are achieved by cycling and/or looping through the TDA, linearly, to increase the bit resolution without demanding high linearity from the TDA. That is, the TDA gains are accumulated after each cycle or loop. The cycling through the TDA allows to obtain higher overall gains while using lower gains through gain addition. This implementation can have a lower throughput rate (relative to a non-cycling implementation) for the output digital data.

In implementations, the SAR-based TDC, due to the highly digital implementation, can support supply voltage/power scaling below 0.9V (i.e., $V_{DD}$=0.55 V in TSMC 3 nm and can easily be integrated with advanced technology nodes (i.e., <7 nm FinFet).

In implementations, since the SAR-based TDC relies on substantially digital circuits, negligible or no static power dissipation is incurred. The VTC is the only block requiring static current when the SAR TDC is used in the context of an ADC or SAR ADC. This results in the SAR-based TDC to operate in low voltage mode. The absence of capacitors in the SAR-based TDC also implies less power dissipation for an equivalent resolution and frequency ADC design that requires capacitors.

In implementations, the SAR-based TDC output digital codes can be delivered in serial format. In implementations, the SAR-based TDC output digital codes can be delivered in parallel code format with an addition of serial to parallel logic.

In implementations, the SAR-based TDC can use a less complicated FSM in contrast to SAR ADCs.

In implementations, internal nodes in the SAR-based TDC are digital signals.

In implementations, since the SAR-based TDC relies on substantially digital circuits, reset and synchronizer clocks can be used in accordance with standard design logic.

FIG. 1 is a block diagram of an example of a SAR-based TDC or SAR-based time-difference digitizer 1000 in accordance with implementations of this disclosure. The SAR-based TDC 1000 includes a first signal path 1100 for processing a first signal or first signal edge (SIGa) and a second signal path 1200 for processing a second signal or signal edge (SIGb), the phase difference of which, ΔΦin, is to be quantized. That is, SIGa and SIGb represent the two signal edges between which a phase difference is measured. In other words, the measurement determines how much SIGb is delayed with respect to SIGa. In some implementations, the signal edge which is ahead of the other signal edge can be referred to as a reference signal. In the illustrative examples herein, SIGa is ahead of or leads SIGb. The roles of SIGa and SIGb can be reversed.

The first signal or SIGa and the second signal or SIGb are signals or signal edges generated by other components with can be internal or external to the SAR-based TDC or SAR-based time-difference digitizer 1000. The SAR-TDC 1000 is quantizing the time difference between the two signal edges. In the case of a SAR-ADC, the signal edges SIGa and SIGb would be the output of a voltage to time converter which takes in the two voltages that are to be quantized into the digital domain, and converts them into time (or two signal edges). This places them into the time mode signal processing realm as the SIGa and SIGb signal edges.

Both the first signal path 1100 and the second signal path 1200 have a reference path for passing through the original signal (or original signal edge) as a reference signal input and a delayed or τ-generation path for delaying the original signal to generate a τ-delayed signal input. The first signal path 1100 includes a first signal reference path 1110 for carrying a first reference signal input (SIGa, refin) and a first signal τ-generation path 1120 for generating a first τ-delayed signal input (SIGa, Δin). The second signal path 1200 includes a second signal reference path 1210 for carrying a second reference signal input (SIGb, refin) and a second signal τ-generation path 1220 for generating a second τ-delayed signal input (SIGb, Δin). Each of the first signal τ-generation path 1120 and the second signal τ-generation path 1220 include a delay unit cell or tau-generation circuit 1122 and 1222, τ, which represents the smallest step size that can be quantized (also referred to as the least significant bit (LSB)). This can also be referred to as LSB generation. In some implementations, the delay unit cell or tau-generation circuit can be configurable, programmable, or tunable based on application and other considerations. The time dynamic range (DR) of the system is then defined as $\tau \cdot 2^N$, where N is the number of bits or resolution.

Both the first signal path 1100 and the second signal path 1200 include a variable gain TDA, which can amplify the time difference in a binary weighted manner through different switching arrangements. The variable gain TDA can provide, for example, gains of 0, 1, 2, 4, 8, 16, and so on depending on the value of N. For example, for N equals 3, the binary weights for the gain would be 0, 1, 2, 4, and 8. However, the initial step in a binary search cuts the dynamic range of $2^3$ to half, so the binary weights needed are 0, 1, 2, and 4. The choice of which switches to turn on is controlled via a finite state machine (FSM) 1400 based on the digital output of the previous comparison level and knowing which step is being processed or has been processed in the conversion process out of the total N steps of the conversion process.

The first signal path 1100 includes a first TDA 1130 and the second signal path 1200 includes a second TDA 1230. The inputs to the first TDA 1130 are the first reference signal input and the first τ-delayed signal input. The inputs to the second TDA 1230 are the second reference signal input and the second τ-delayed signal input. Each TDA outputs a pair of signal edges, a reference edge and an amplified edge. The reference edge (labelled as "unused") is a reference edge or reference time used to determine when to detect or measure the amplified edge. In this instance, the reference edge is unused in that it does not connect to the rest of the circuit. Essentially, if the reference edge or time from the first signal path 1100 and the reference edge or time from the second signal path 1200 occur at the same time, then only the two remaining signals, i.e., the amplified signals, need to be measured with respect to each other.

The first TDA 1130 outputs a first reference output signal (edge) (SIGa, refout), which is used to measure a first amplified output signal (edge) (SIGa, out). The second TDA 1130 outputs a second reference output signal (edge) (SIGb, refout), which is used to measure a second amplified output signal (edge) (SIGb, out). The first amplified output signal and the second amplified output signal are input to phase comparator 1300 to determine which of the first amplified output signal and the second amplified output signal arrives first. That is, the phase comparator 1300 can compare differential phase difference between the first amplified output signal and the second amplified output signal. In some implementations, the phase comparator 1300 can be a D-type flip flop (DFF), where the first amplified edge is input to the CLK input of the DFF and the second amplified edge is input to the D input. In this illustrative example, Qb is high '1' when CLK precedes D (i.e., SIGa is ahead of SIGb).

The outputs of the phase comparator 1300, which are also outputs of the SAR-based TDC or SAR-based time-difference digitizer 1000, are input to the FSM 1400, which in turn can control the switches, gains, and other components in the first TDA 1130 and the second TDA 1230. The FSM 1400 contains multiplexers, switches, logic gates, and/or other components controlled by proper non-overlapping clocks which dictate which of the conversion steps is presently occurring or is finished to control the TDA gain setting of each of the first TDA 1130 and the second TDA 1230. The time separation of these non-overlapping clocks is dictated by the speed of the TDA and is chosen to allow its time amplification to be completed before the new clock phases/signals are fed back.

The FSM 1400 can output control bits for each of the first TDA 1130 and the second TDA 1230 based on the outputs of the phase comparator 1300. In the instance that the phase comparator 1300 is a DFF, Q and Q b are complementary output bits which can be used simultaneously within the FSM 1400 to generate control bits for the first TDA 1130 and the second TDA 1230. For a SAR-based TDC where N is 3 and SIGa leads SIGb, the FSM 1400 can provide state control of the first TDA 1130 and the second TDA 1230 in each of the 3 steps. In a first step or step 0, a first gain (Ga0) of the first TDA 1130 is set to 4 and a first gain (Gb0) of the second TDA 1230 is set to 0. In a second step or step 1, a second gain (Ga1) of the first TDA 1130 is set to 2 if Q is 0, otherwise Ga1 is set to 0. In the second step or step 1, a second gain (Gb1) of the second TDA 1230 is set to 2 if Qb is 0, otherwise Gb1 is set to 0. In a third step or step 2, a third gain (Ga2) of the first TDA 1130 is set to 1 if Q is 0, otherwise Ga2 is set to 0. In the third step or step 2, a third gain (Gb2) of the second TDA 1230 is set to 1 if Qb is 0, otherwise Gb2 is set to 0. As such, a binary weighted search is implemented for the SAR-based TDC 1000.

Figure 2:
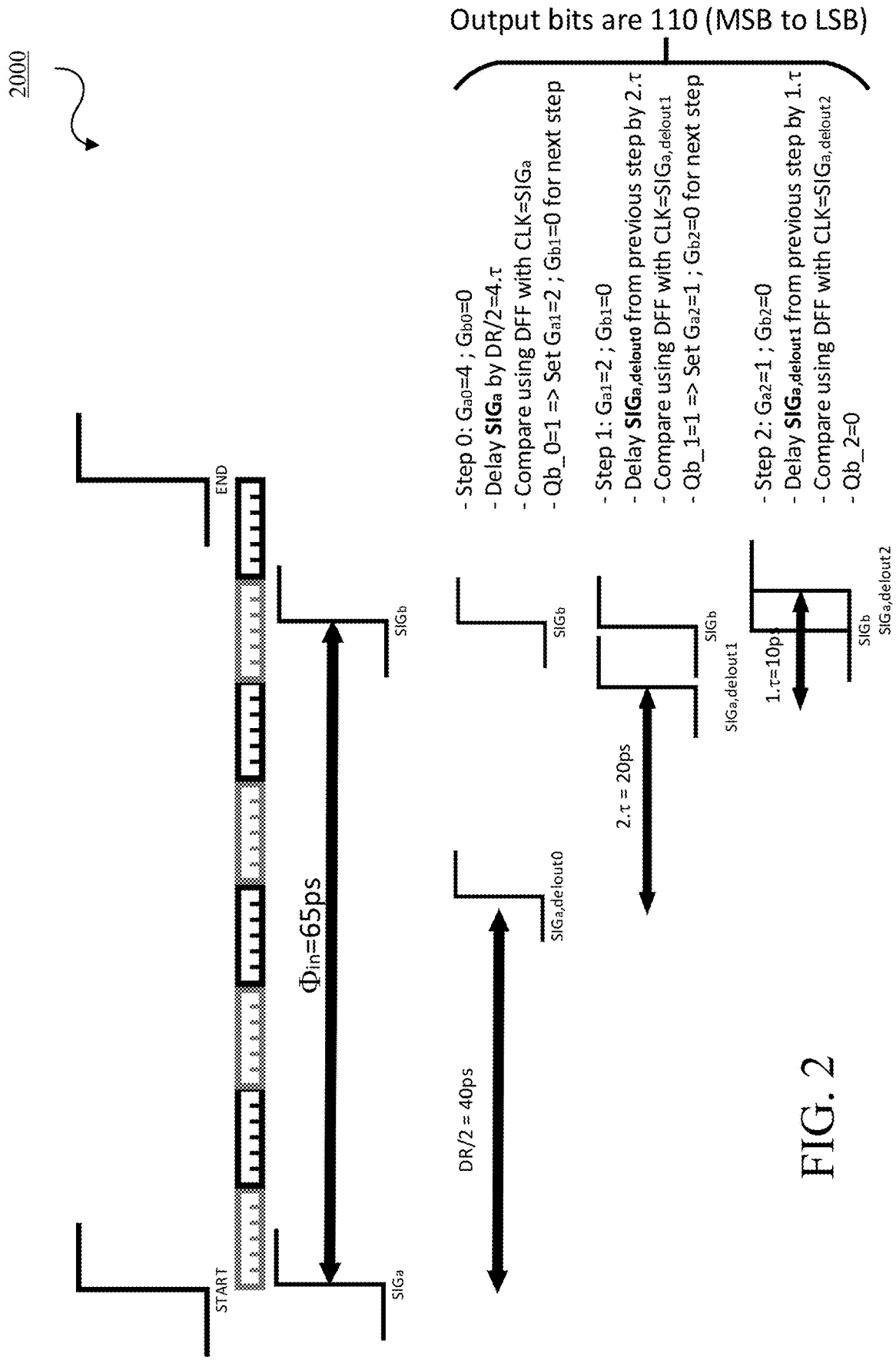
FIG. 2 is a time diagram of an example method using a SAR-based TDC in accordance with implementations of this disclosure.

Operation of the SAR-based TDC 1000 is shown with reference also to FIG. 2, which is an example timing diagram 2000 of the SAR-based TDC 1000 where N equals 3 in accordance with implementations of this disclosure. For simplicity, single ended phases are depicted but, as noted in FIG. 1, the TDA will have a differential set of edges for each the two signal paths. As noted, the timing diagram 2000 is for a 3-bit case (N=3) where the phase difference to be measured/quantized is chosen at 65 ps for this illustration. The LSB in this example is $\tau$=10 ps. The timing diagram 2000 shows the output phases before the DFF and at the output of the DFF, which sequentially, in three steps, generates the three-bits representation of the digital quantized version of 65 ps. Operationally, a method starts by delaying the leading edge signal to place it in the middle of the time DR of the SAR-based TDC, referred to as mid-scale generation (or step 0). In this step, the time gain is set to DR/2 or $2^{N-1}$, or 4 in this 3-bit example, meaning the leading signal is delayed by 4$\tau$. A phase comparison is then performed by the DFF to generate the most significant bit (MSB) digital output by discerning if SIGa continues to lead SIGb. The digital output is sent to the FSM. Based on the digital logic output of this MSB, the signal that is still ahead is then delayed in Step 1, but this time by 2$\tau$ by setting the time gain to 2. Finally, the gain of the signal path that is ahead is then set to 1 which is equivalent to delaying the leading signal after Step 1 by 1$\tau$ to generate the LSB in this final conversion step (Step 2).

As noted, the LSB step size is 10 ps. Phases are delayed in time by a binary multiples of the LSB. In this example, SIGa is 65 ps ahead of SIGb. In the first step of the conversion (step 0), Ga is set to 4 and Gb is set to 0. SIGa is delayed by DR/2 or 4$\tau$, i.e., 40 ps in this example. This is the mid-scale generation. A first comparison is made by the DFF, generating an MSB of '1'. In the second step (step 1), since the previous step digital output is logic high, Ga is set to 2 and Gb remains at 0. In other words, SIGa is delayed further, but this time by 2$\tau$ i.e., 20 ps. A second comparison is made by the DFF, generating a second bit of '1'. In the third and last conversion step (step 2), since the previous step digital output is logic high, Ga is set to 1 and Gb remains at 0. In other words, SIGa is delayed further, but this time by $\tau$ i.e., 10 ps. At this step, SIGa becomes delayed with respect to SIGb and the digital bit (LSB) at the output of the DFF is logic low '0'. The final converted digital signal is then '110'.

Figure 4:
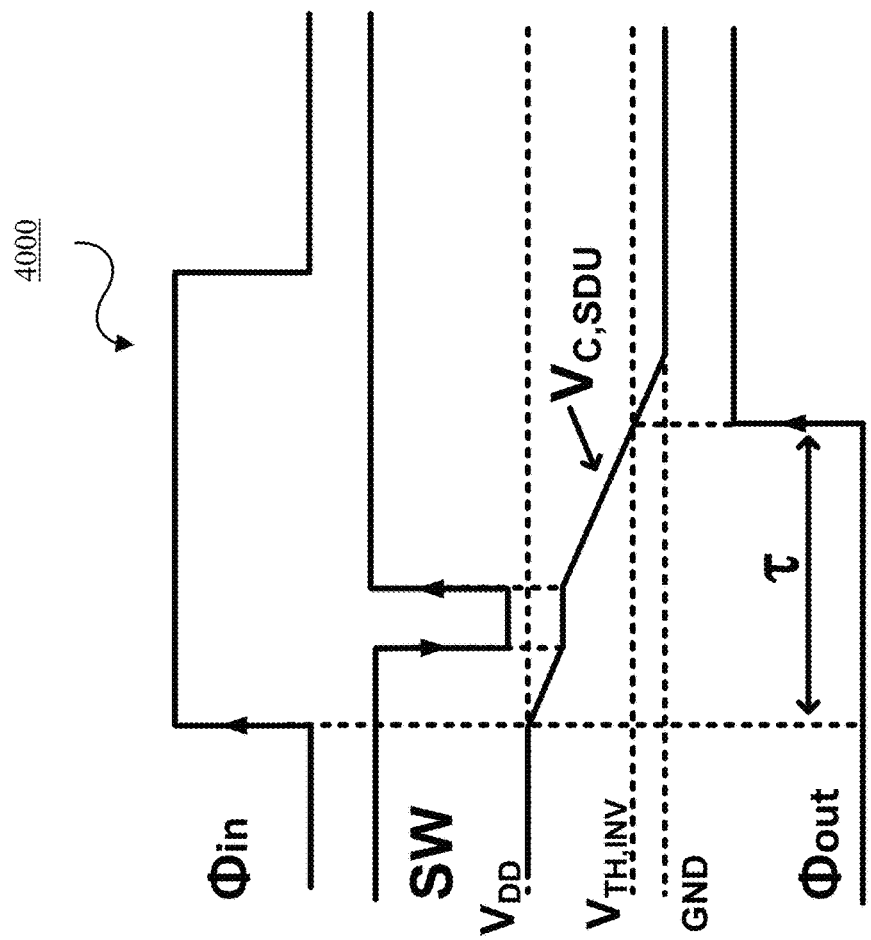
FIG. 4 is a timing diagram for the tau generation circuit of FIG. 3 in accordance with implementations of this disclosure.
Figure 3:
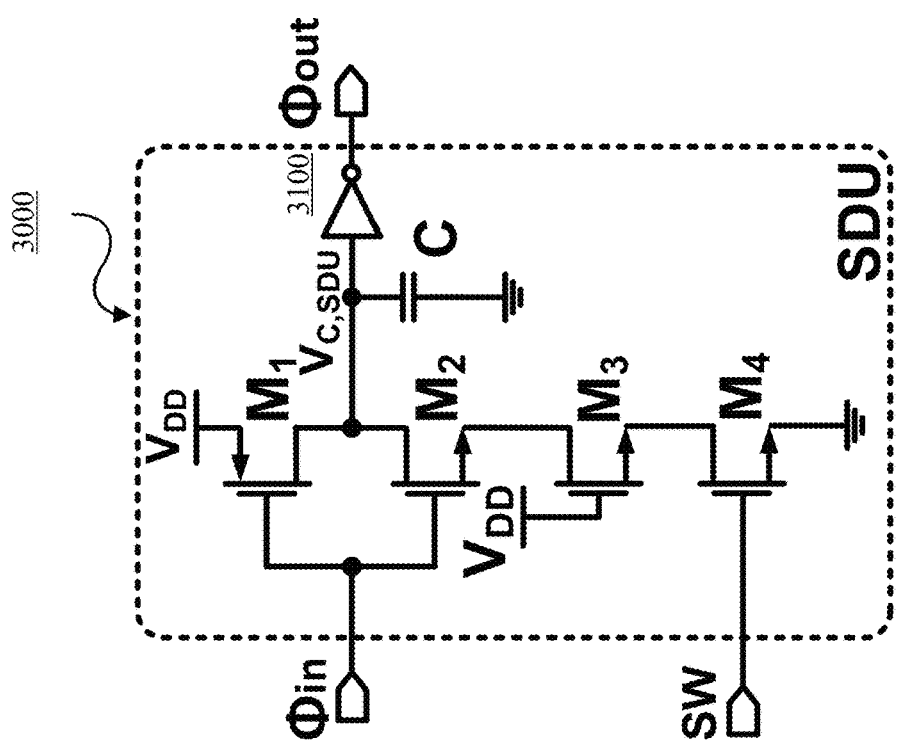
FIG. 3 is a block diagram of an example of a tau generation circuit in accordance with implementations of this disclosure.

FIG. 3 is a block diagram of an example of a signal delay unit (SDU) 3000 which can be used for a tau-generation circuit in accordance with implementations of this disclosure. FIG. 4 is a timing diagram 4000 for the SDU 3000 in accordance with implementations of this disclosure. The SDU 3000 includes a transistor $M_1$ having a source connected to $V_{DD}$ and a drain connected to a drain of a transistor $M_2$, which in turn has a source connected to a drain of a transistor $M_3$. A source of the transistor $M_3$ is connected to a drain of a transistor $M_4$, which in turn has a source connected to ground. A signal or signal edge is connected to a gate of the transistor $M_1$ and the transistor $M_2$, $V_{DD}$ is connected to a gate of the transistor $M_3$, and a switch signal is connected to a gate of the transistor $M_4$ to control the discharging path and latch the input data. An input of an inverter 3100 is connected to the drains of the transistor $M_1$ and the transistor $M_2$, which provides an output of the SDU 3000. In some implementations, a capacitor C is connected to the input of the inverter 3100. When the voltage of C ($V_{C,SDU}$) drops below a threshold voltage ($V_{TH,INV}$), the transistor stack at the output of SDU 3000 changes the output from "0" to "1". The switch signal determines whether or not to deliver an output signal.

Figures 5, 6:
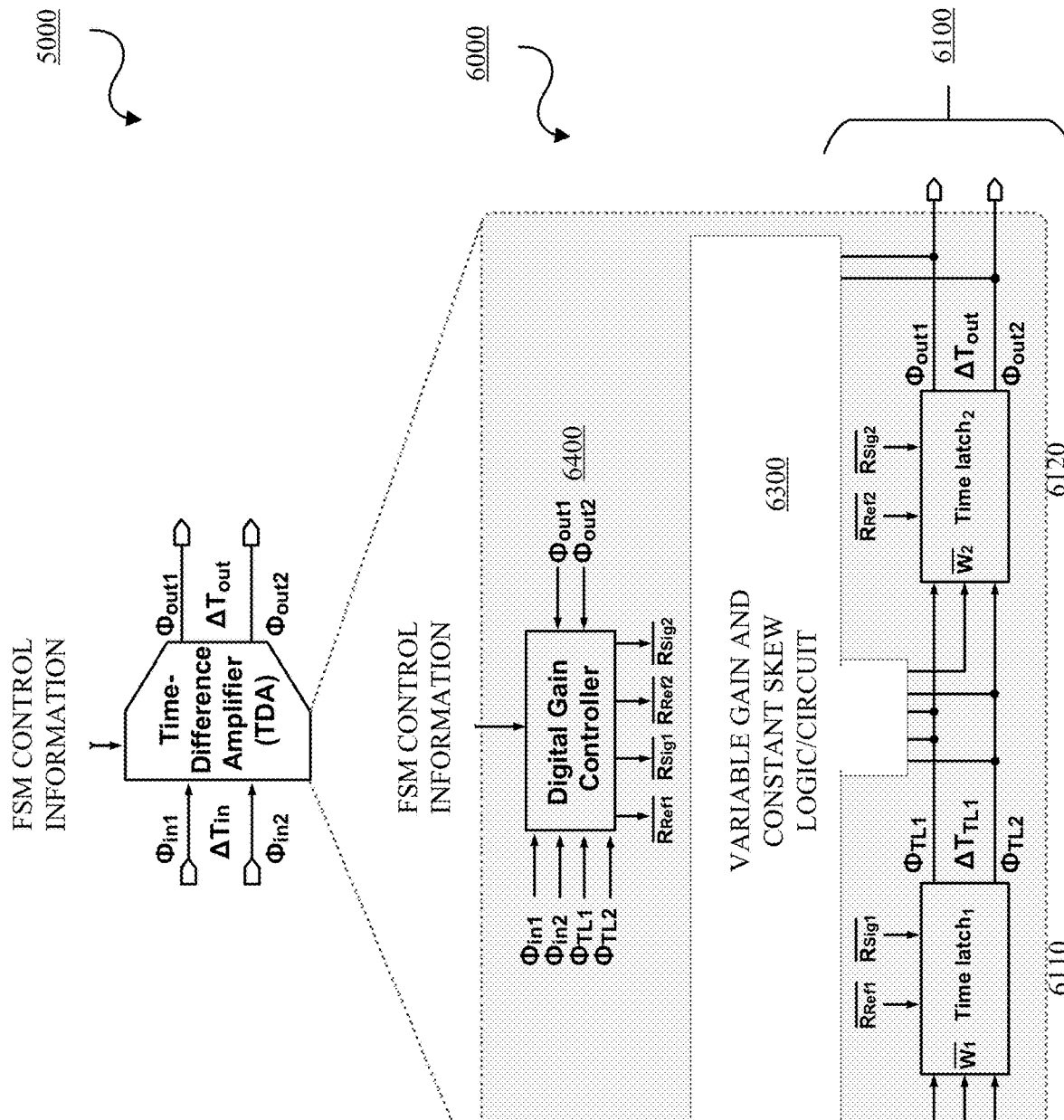
FIG. 5 is a block diagram of an example of a time difference amplifier in accordance with implementations of this disclosure.
FIG. 6 is a block diagram of a time difference amplifier in accordance with implementations of this disclosure.
Figure 5A:
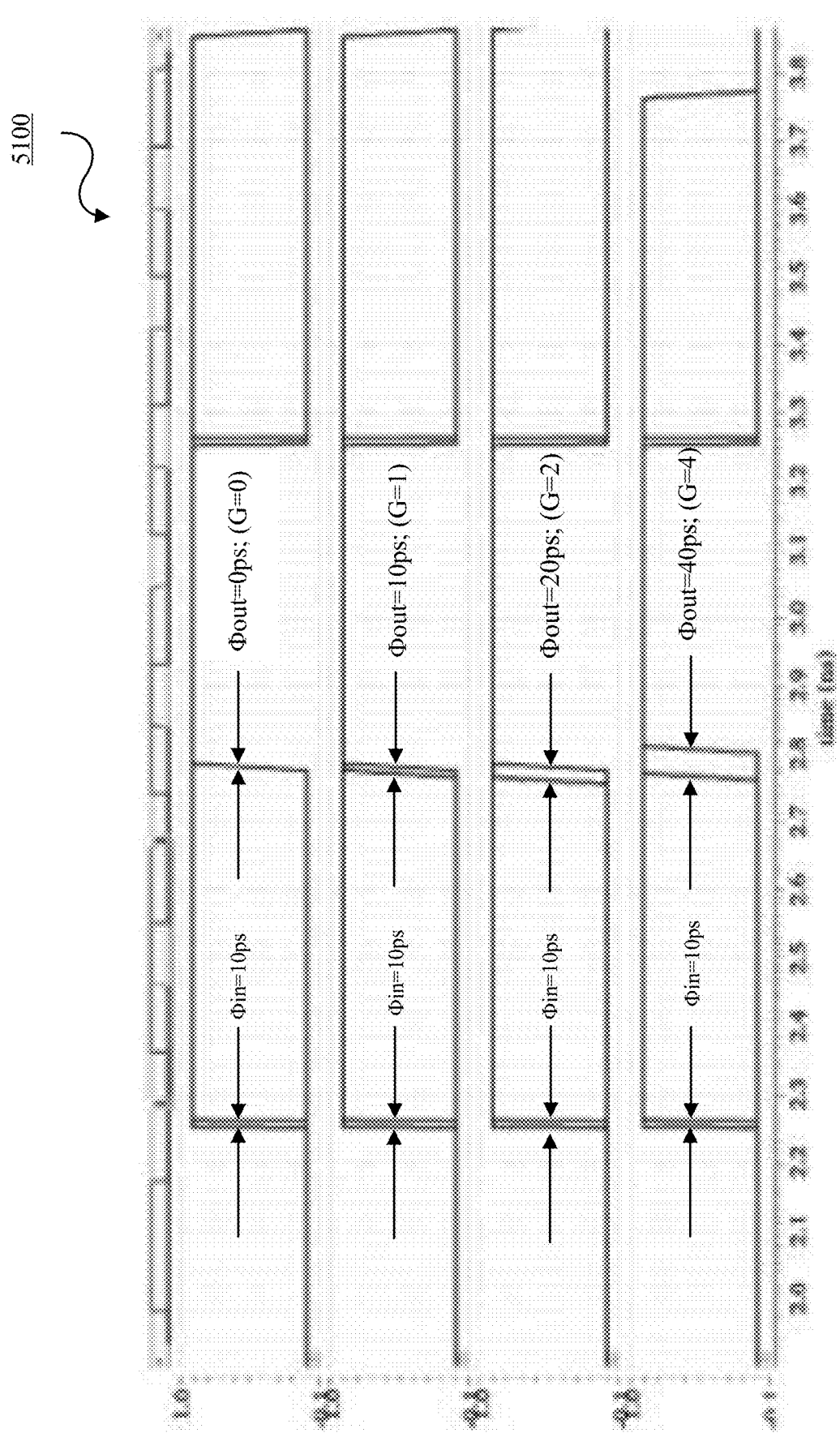
FIG. 5A is a timing diagram of an example simulation based on a SAR-based TDC in accordance with implementations of this disclosure.

FIG. 5 is a block diagram of an example of a variable gain TDA 5000 in accordance with implementations of this disclosure. The variable gain TDA 5000 block takes in a differential input and gives out a differential output. The "differential" nature comes from the fact that signal or time edges need their appropriate reference or "ground" to carry phase information meaningfully. As shown in FIG. 1, only one of these two signals from each path is fed to a phase comparator, such as a DFF, for phase comparison and is assumed to be carrying the phase difference to be measured. This is enabled because the TDA 5000 generates a constant skew (constant within $\tau$, which is the minimum time resolution the system can discern) as a function of its different gain settings. Only then can the "time-mode ground" from each of the two paths be dropped. FIG. 5A is a timing diagram 5100 of an example simulation based on a SAR-based TDC in accordance with implementations of this disclosure. The simulation results confirm this correct functionality and requirement under the different gain settings of 0, 1, 2 and 4. A gain of 0 means the two differential edges at the output of the TDA 5000 coincide with each other, irrespective of their phase difference at the input of the TDA 5000.

FIG. 6 is a block diagram of a variable gain TDA 6000 in accordance with implementations of this disclosure. The variable gain TDA 6000 is illustrated for a 3 bit SAR-based TDA and can provide controllable binary weighted gains of 0, 1, 2, and 4. The TDA 6000 includes a two-stage time latch 6100, which is connected to a variable gain and constant skew circuit 6300 and a digital gain controller 6400. TDA 6000 and certain of the components therein are described in S. Ziabakhsh, G. Gagnon, and G. W. Roberts, "An All-Digital High-Resolution Programmable Time-Difference Amplifier Based on Time Latch," IEEE International Symposium on Circuits and Systems, November 2018, the contents of which are herein incorporated by reference as if set forth in their entirety.

A M-stage time latch can provide $2^M$ gains subject to non-linearity issues. The two-stage time latch 6100 can provide 4 gain setting or values. The two-stage time latch 6100 includes a first time latch 6110 connected to a second time latch 6120. The first time latch 6110, the second time latch 6120, and the variable gain and constant skew circuit 6300 are connected to provide the binary weighted gains, i.e., 0, 1, 2, and 4, as controlled by the digital gain controller 6400. As described herein, an FSM can provide control information to the digital gain controller 6400 to set a gain value for the TDA 6000. The digital gain controller 6400 inputs the FSM control information, the inputs to the first time latch 6110, the outputs from the first time latch 6110, and the outputs from the second time latch 6120 (which are the outputs of the TDA 6000), to generate reference and signal read control signals, $\sqrt{R_{Ref1}}$ and $\sqrt{R_{Stg1}}$ and $\sqrt{R_{Ref2}}$ and $\sqrt{R_{Stg2}}$, for each of the first time latch 6110 the second time latch 6120, respectively.

Figure 7:
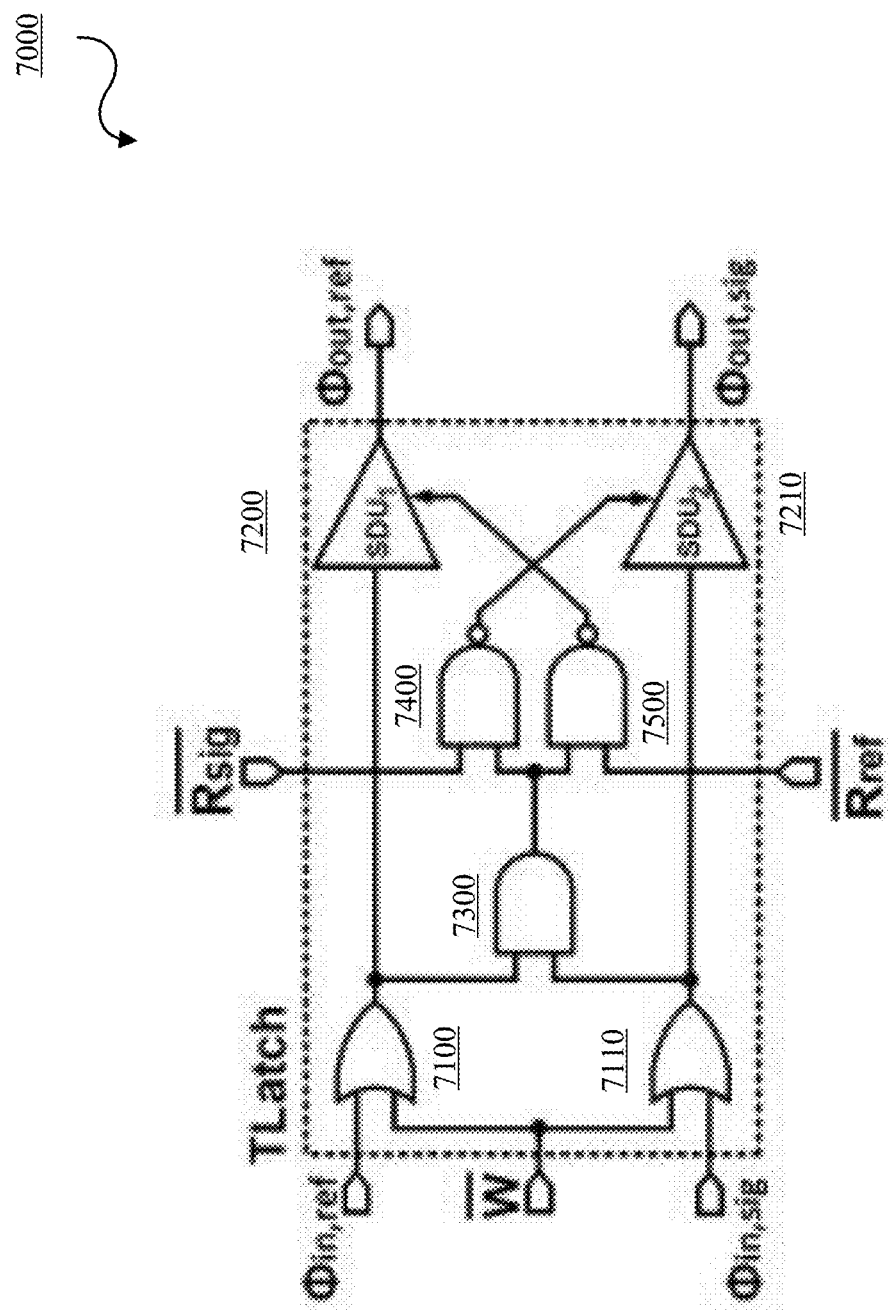
FIG. 7 is a block diagram of a time latch in accordance with implementations of this disclosure.
Figure 8A:
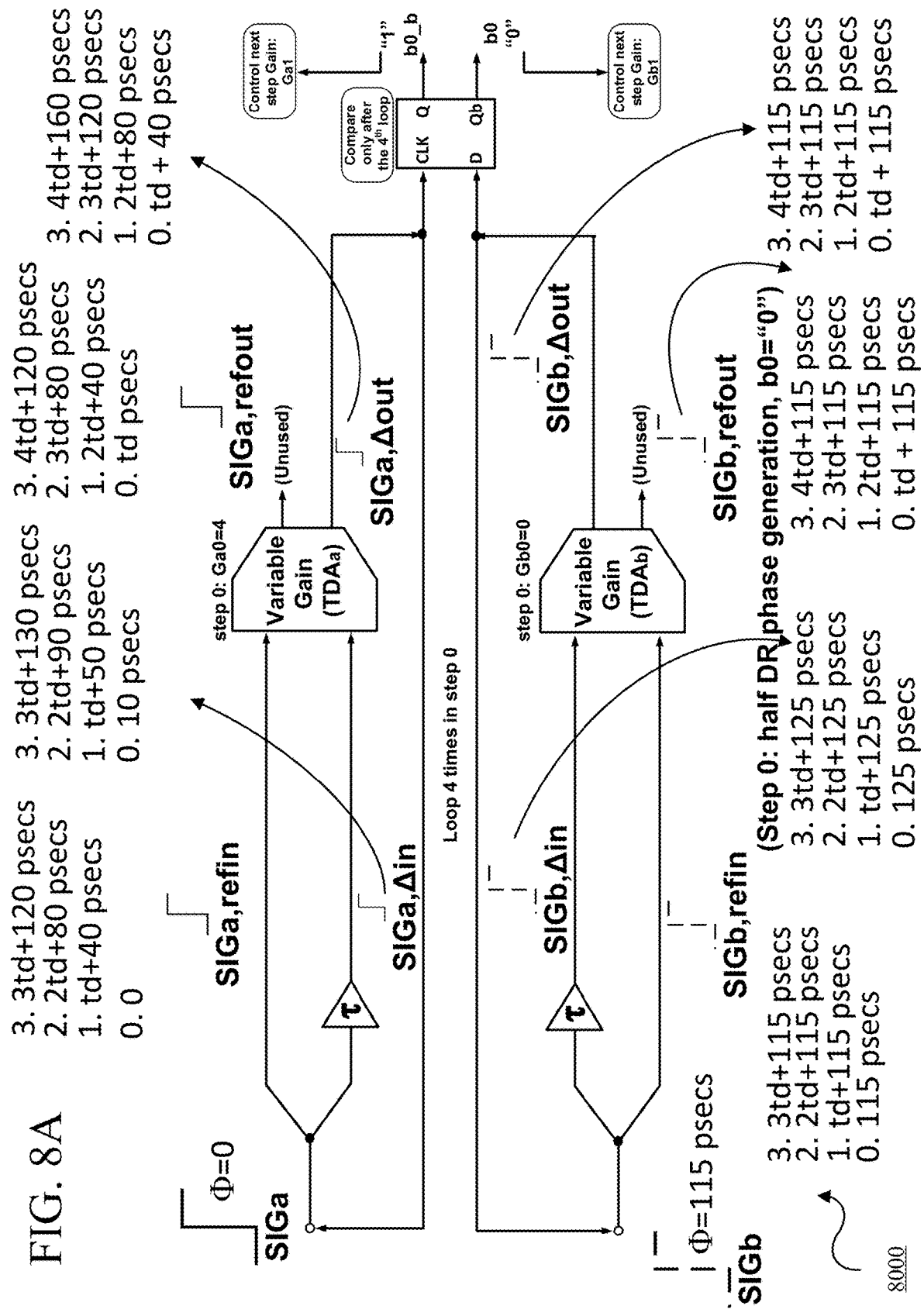
FIGS. 8A-8E are block diagrams of an example of using a loop, cycling, or accumulation method in a SAR-based TDC in accordance with implementations of this disclosure.
Figure 8B:
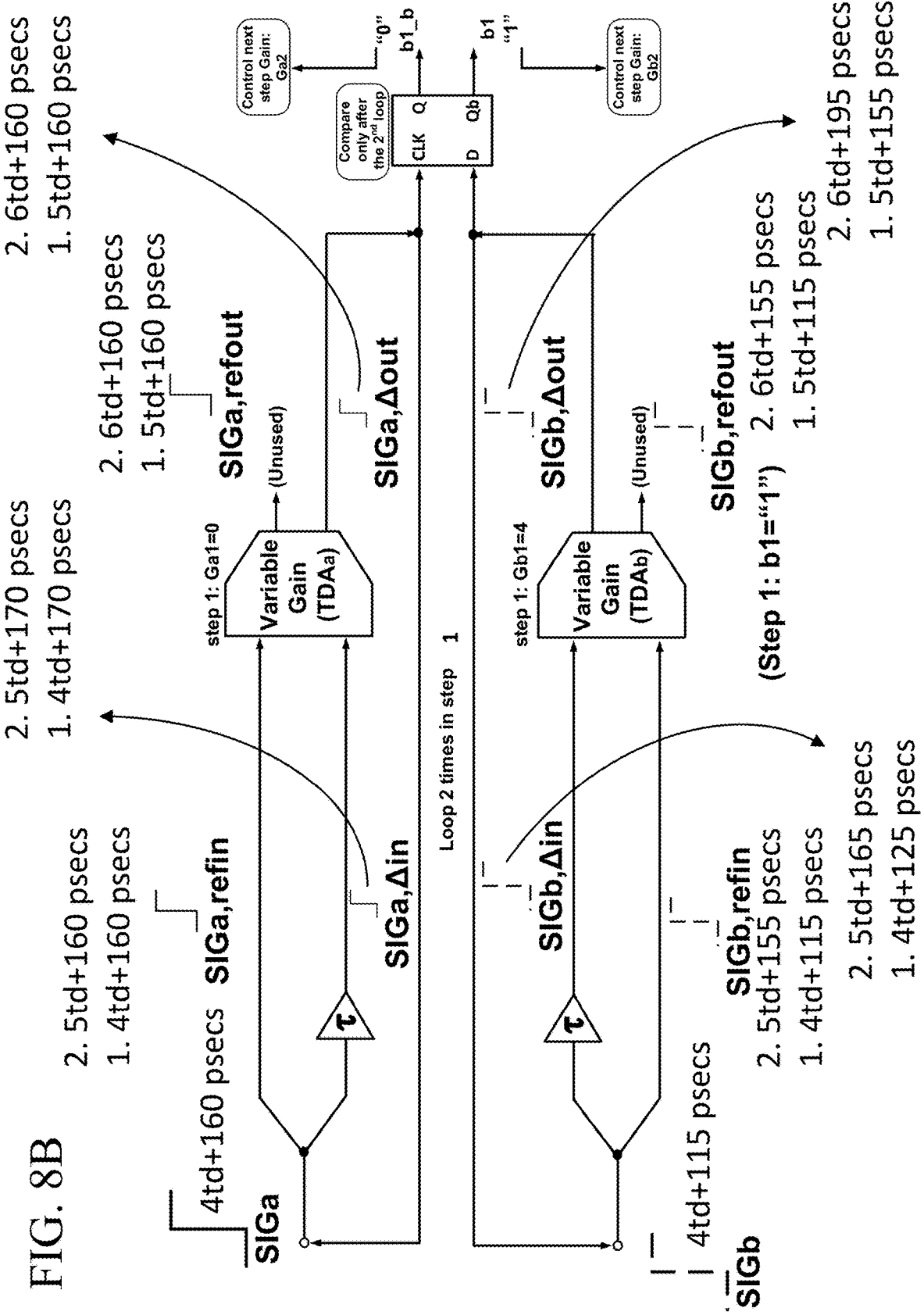
Figure 8C:
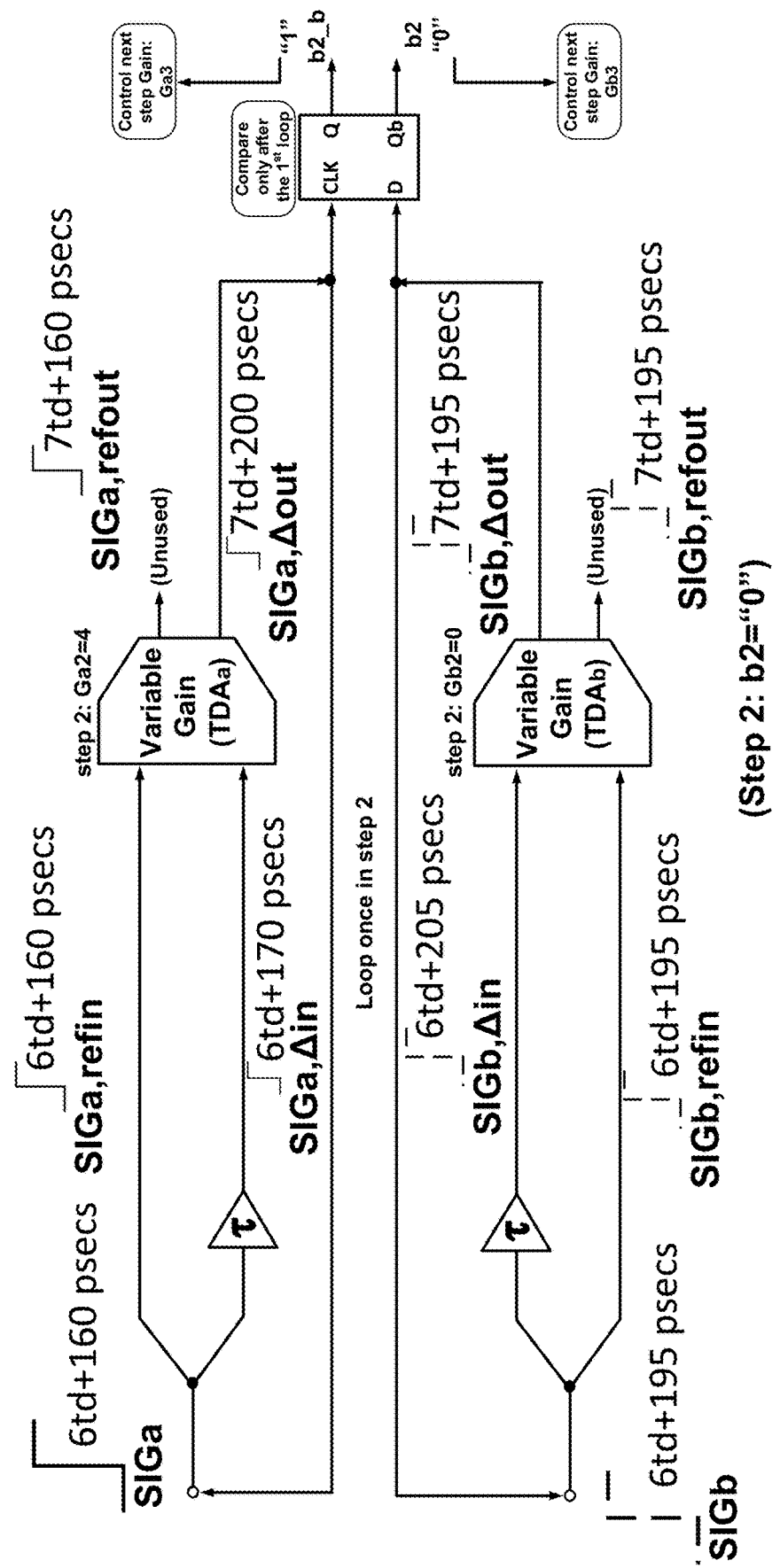
Figure 8D:
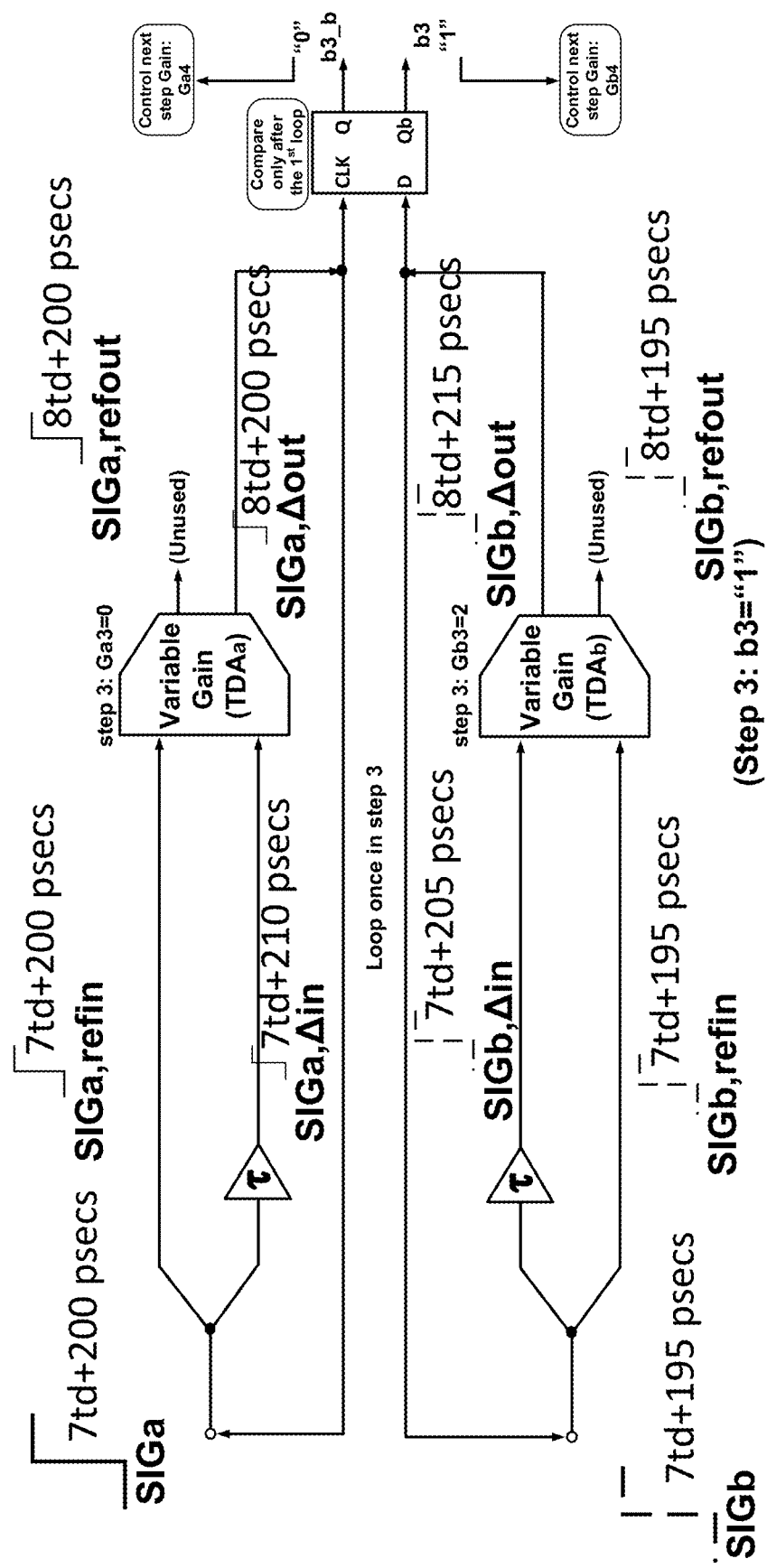
Figure 8E:
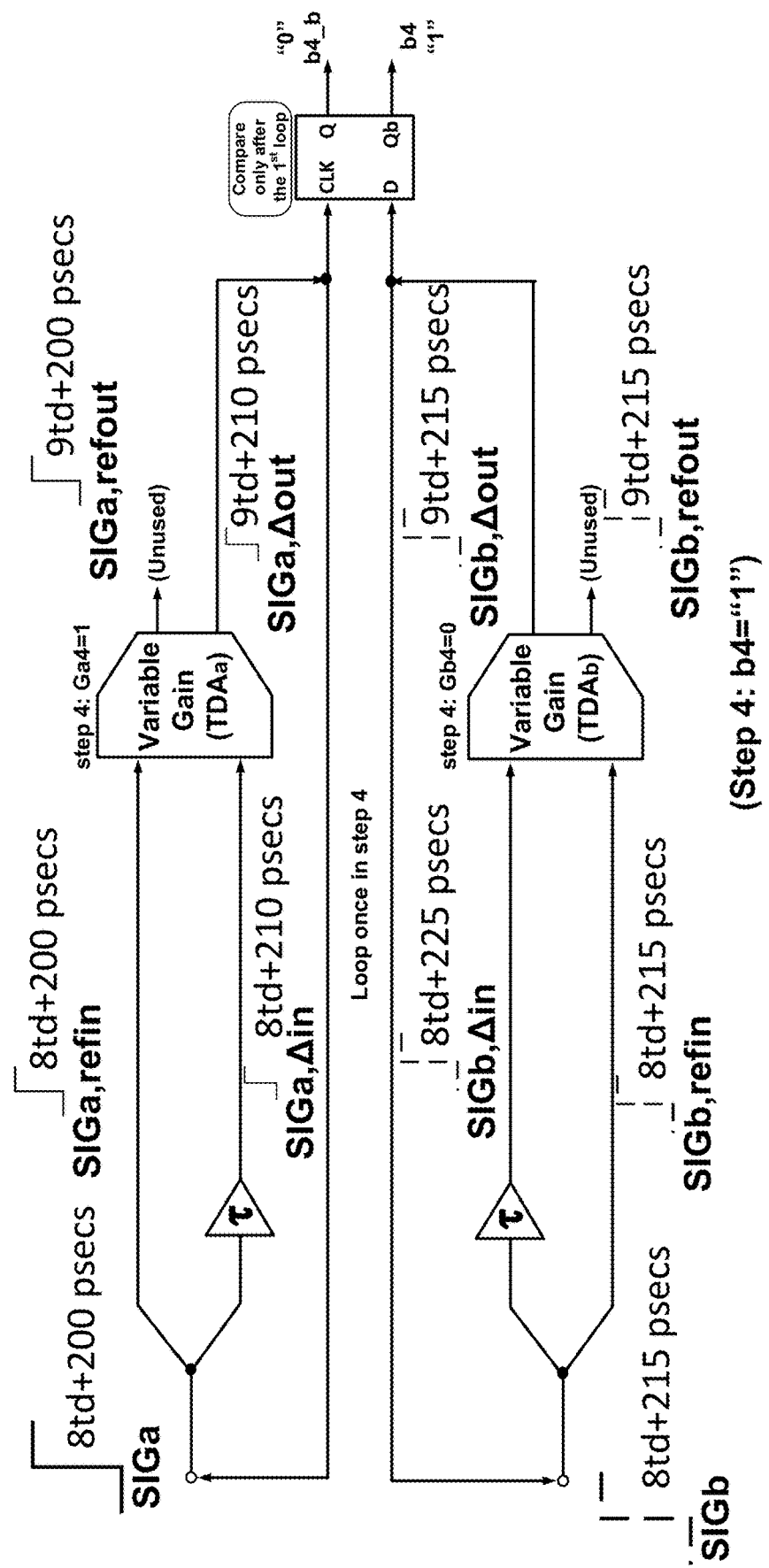

Each of the first time latch 6100 and the second time latch 6200 can be implemented as shown in FIG. 7 and as described in M. Ali-Baklishian and G. W. Roberts, "A Digital Implementation of a Dual-Path Time-to-Time Integrator," *IEEE Transaction on Circuits and Systems I: Regular Papers*, vol. 59, no. 11, pp. 2578-, November 2012, the contents of which are incorporated herein by reference as if set forth in its entirety. FIG. 7 is a block diagram of a time latch 7000 in accordance with implementations of this disclosure. The time latch 7000 includes a pair of input OR gates 7100 and 7110, where a reference input is connected to one input of the OR gate 7100 and a signal input is connected to one input of the OR gate 7110. The other inputs of the OR gate 7100 and the OR gate 7110 are connected together and connected to a write signal, $\overline{W}$. The output of the OR gate 7100 is connected to a $SDU_1$ 7200 and the output of the OR gate 7110 is connected to a $SDU_2$ 7210. The outputs of the OR gate 7100 and the OR gate 7110 are further connected to a AND gate 7300. The output of the AND gate 7300 is connected to an input of a NAND gate 7400 and to an input of a NAND gate 7410. A $\sqrt{R_{Stg}}$ is connected to a remaining input of the NAND gate 7400 and a $\sqrt{R_{Ref}}$ is connected to a remaining input of the NAND gate 7410. The output of the NAND gate 7400 controls the $SDU_2$ 7210 in outputting a signal output and the output of the NAND gate 7410 controls the $SDU_1$ 7200 in outputting a reference output. Each of the $SDU_1$ 7200 and the $SDU_2$ 7210 can be implemented as shown in FIG. 3 and operate as shown in FIG. 4.

Referring now also to FIG. 3 and FIG. 4, the $SDU_1$ 7200 and the $SDU_2$ 7210 have equal valued capacitors and are charged to $V_{DD}$ through a transistor M1 when CLK ($\Phi_{in}$) is "0". The write signal $\overline{W}$ captures the input time-differences and holds it until the read signals ($\sqrt{R_{Stg}}$ and $R_{Ref}$) arrive. During the writing phase, the capacitor in $SDU_1$ 7200 starts to discharge linearly through NMOS transistors M2-M4. At the falling edges of the read signals, both capacitors in the $SDU_1$ 7200 and the $SDU_2$ 7210 continue to discharge. When the voltage of the capacitors drops below the threshold voltage, the transistor stacks at the outputs of the $SDU_1$ 7200 and the $SDU_2$ 7210 change the output from "0" to "1". The time difference at the output, $\Delta T_{out}$ or $\Delta T_{TL1}$, is the same as the time difference at the input, $\Delta T_{in}$, and is thus memorized and retrieved at a later time. The time latch 7000 can perform time addition and time subtraction with appropriate logic gates as described in S. Ziabakhsh, G. Gagnon, and G. W. Roberts, "An All-Digital High-Resolution Programmable Time-Difference Amplifier Based on Time Latch," IEEE International Symposium on Circuits and Systems, November 2018, the contents of which are herein incorporated by reference as if set forth in their entirety.

As noted, for a 3 bit SAR-based TDC, the TDA has to provide binary weighted gains of 0, 1, 2, and 4. This would mean that the TDA is a 2-stage time latch circuit. The extension to higher order bits can be achieved in a straightforward manner by using a TDA with more programmability for its variable gains. For example, for a 4 bit SAR-based TDC, the TDA has to provide binary weighted gains of 0, 1, 2, 4, and 8. This would mean that the TDA is a 3-stage time latch circuit. For a 5 bit SAR-based TDC, the TDA has to provide binary weighted gains of 0, 1, 2, 4, 8, and 16. This would mean that the TDA is a 4-stage time latch circuit. In general, the largest gain the TDA needs to provide is equal to DR/2 to be able to generate the mid-scale range. The larger the required gain, the more the number of time latches, the lower the gain linearity, and the larger the area and complexity. The conversion time is not a concern in this scenario of increased TDA gain programmability. Adding time latch stages to increase the achievable TDA gain will incur some extra time delays due to the extra logic needed, but those gate delays are usually much shorter than the full clock cycle needed to loop through the TDA. The linearity of the TDA becomes the limiting factor as time latch stages are added.

Extending the bit resolution of the measurement system can be addressed by use of a looping mechanism to generate larger TDA gains from lower gains, e.g., a two-stage time latch, through gain addition or gain accumulation. The number of time latch stages and number of loops is a trade-off based on skew, jitter, non-linearity, and other factors. For example, for a 5 bit TDC, an implementation can be a TDA having a gain of 16 with one loop, an implementation can be a TDA having a gain of 8 with two loops, an implementation can be a TDA having a gain of 4 with four loops, an implementation can be a TDA having a gain of 2 with eight loops, and an implementation can be no TDA and performing $2^{N-1}$ loops as the binary search cuts the dynamic range by half before the search starts.

FIGS. 8A-8E are block diagrams of an example of using looping, cycling, or an accumulation method in a SAR-based TDC 8000 in accordance with implementations of this disclosure. The SAR-based TDC 8000 is similar in structure and operation to the SAR-based TDC 1000 and components described in FIGS. 2-7 unless otherwise noted herein.

In the first step of the conversion, generation of the mid-range requires a gain of $2^5/2=16$. With a maximum TDA gain setting of 4 for the two-stage time latch, four loops are needed to achieve a gain of 16. This generates the required mid-scale at the expense of three extra clock cycles.

In the second step of the conversion, a gain of 8 is required to either advance the SIGa or SIGb by 8τ (the choice of which path to be delayed is dictated by the digital output of the previous step). This can be achieved by looping through the TDA twice (i.e., using an extra clock cycle than is usually necessary). Note that while in the multiple-looping stages (e.g., step 0 and step 1), the TDA gain setting is fixed at 4 and 2, respectively, and does not need to be controlled by the digital output of the conversion step. This can be implemented within the FSM through proper switches and/or multiplexers and appropriate non-overlapping clocks, and sending appropriate control information and/or bits.

In the last three conversion steps, an appropriate gain can be achieved with a single looping through the TDA. Hence in total, the 5 bits are obtained after nine clock cycles, resulting in an extra four clock cycles required for this conversion.

Detailed phase information along the TDA input and output paths are also shown in FIGS. 8A-8E for an example input phase difference of 115 ps. The five steps needed for a 5-bit SAR TDC are shown with detailed intermediate phases timing before and after the TDA of both paths a and b for an example Φin of 115 ps. Step 0, or the midscale generation is achieved by looping through the TDA four times to generate the effective time gain of 16, using a gain of only 4. The FSM that was shown earlier in FIG. 1 is not shown here for convenience. The switching arrangement and multiplexing would be controlled again by non-overlapping clocks, but now also includes extra logic to discern whether looping is in use around the TDA (in which case, the gain setting of the TDA remains fixed through the looping stages), or whether no looping is being used, where the gain of the TDA would then be additionally controlled by the previous conversion step digital output. After the 4th iteration, the phase comparison occurs. Step 1 is then achieved through looping twice through the TDA to get a gain of 8 with phase comparison occurring after the second loop. The remaining 3 steps (Steps 2, 3 and 4) are then achieved through a regular single loop conversion. td in this illustration is there to represent the delay introduced by the TDA (or the time at which the TDA is ready to latch its amplified output phases). The final digital output is then '01011'.

In some implementations, a serial-to-parallel converter can be added at the output to retrieve the digital output in parallel fashion.

Figure 9:
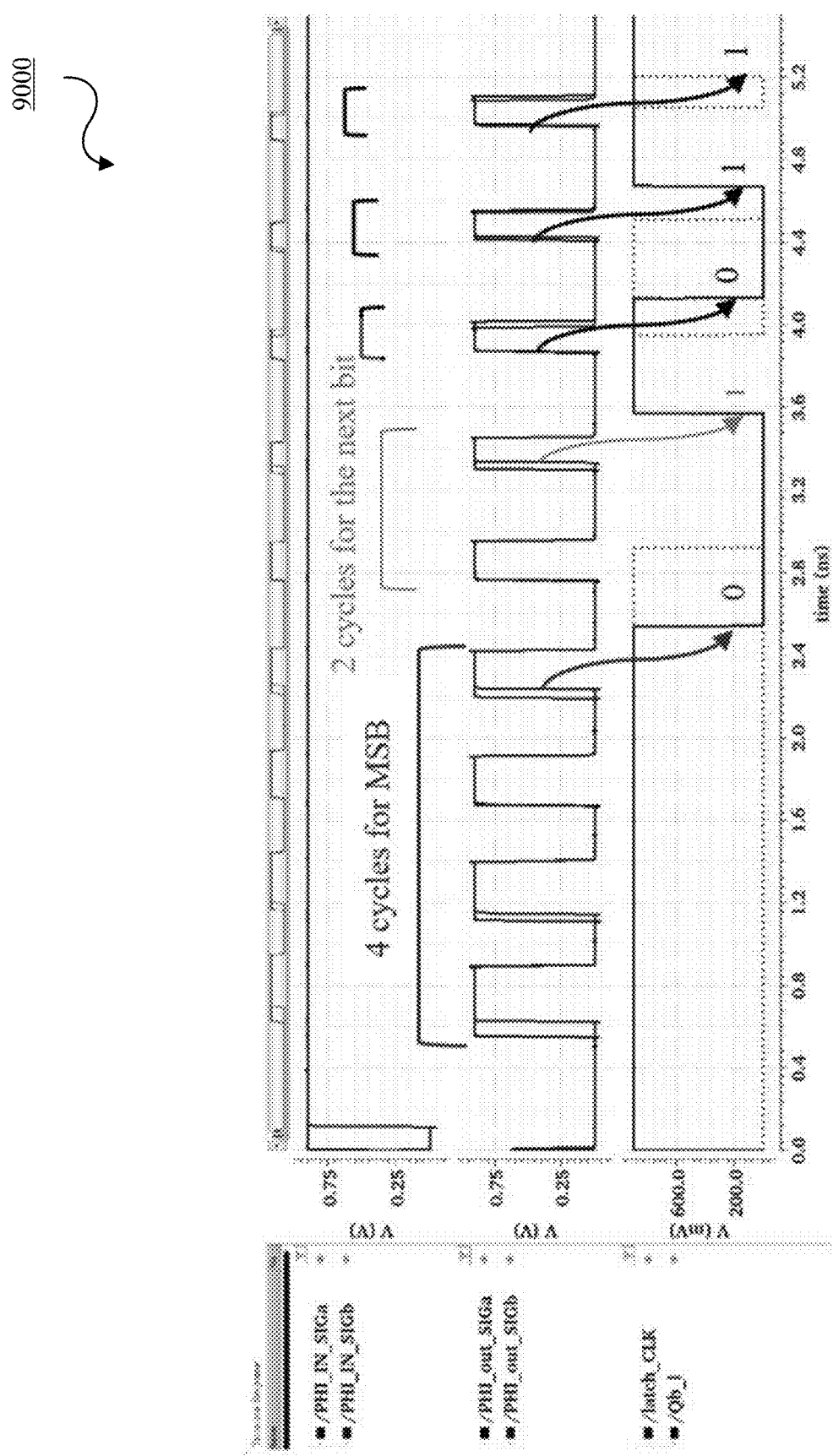
FIG. 9 is a timing diagram for the SAR-based TDC loop, cycling, or accumulation method of FIGS. 8A-8E in accordance with implementations of this disclosure.

FIG. 9 is a timing diagram 9000 for the SAR-based TDC loop, cycling, or accumulation method of FIGS. 8A-8E in accordance with implementations of this disclosure. System level simulation results for an input phase difference of ~114 ps, using a TDA of gain up to 4, and looping through it 4 times in step 1, and 2 times in step 2, respectively to get the first and second most significant bits. The 3 remaining bits are then each obtained in a single loop through the TDA. The final digital representation is then obtained as '01011'. This digital output is latched on the appropriate clock edges (as shown in dashed line format (- - -) in the waveform. The simulation results confirm functionality of the proposed system using a combination of behavioral models and digital standard cells for the building blocks (such as multiplexers, logic gates, delay elements) shown in FIGS. 8A-8E.

Referring back to FIG. 1, the SAR-based TDC 1000 can provide phase difference measurement. In some implementations, one or more voltage-to-time converter (VTCs), such as VTC 1500, can be included as a front-end VTC to the SAR-based TDC 1000 to provide voltage quantization as a voltage-mode SAR-ADC. The VTC 1500 can be implemented using the SDU 3000 of FIG. 3. In this instance, the SW signal at the gate of transistor M4 is replaced by a sampled-and-held analog voltage that is to be converted to time. In this case, and referring again to FIG. 1(b), the time difference between Φin and Φout edges will encode, in time, the DC voltage information present at the gate of transistor M4. In some implementations, the VTC 1500 can be implemented using common mode ramp generation circuits to increase linearity, voltage range, and the like.

Figure 10:
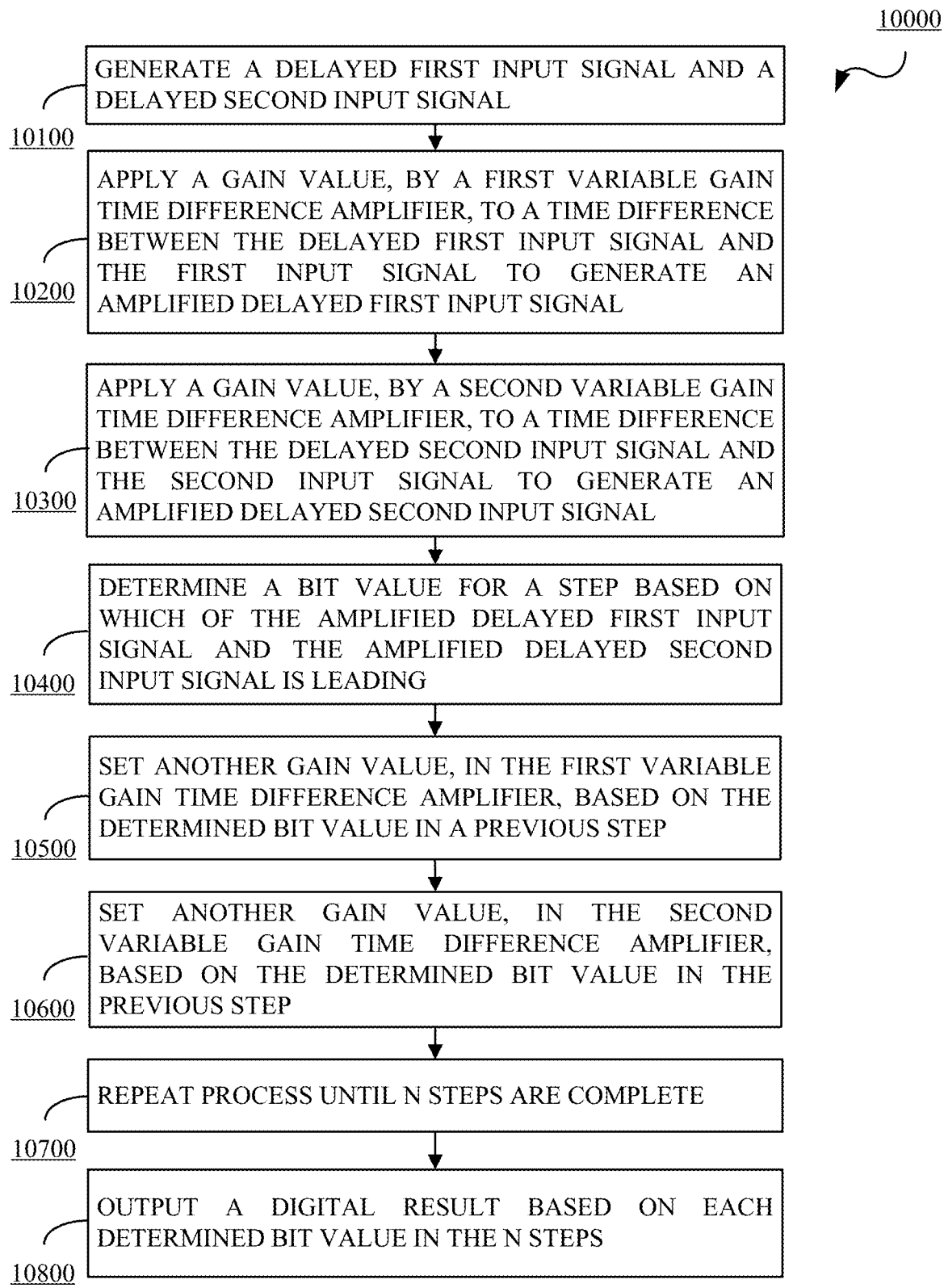
FIG. 10 is a flowchart of an example technique for a SAR-based TDC in accordance with embodiments of this disclosure.
Figure 11:
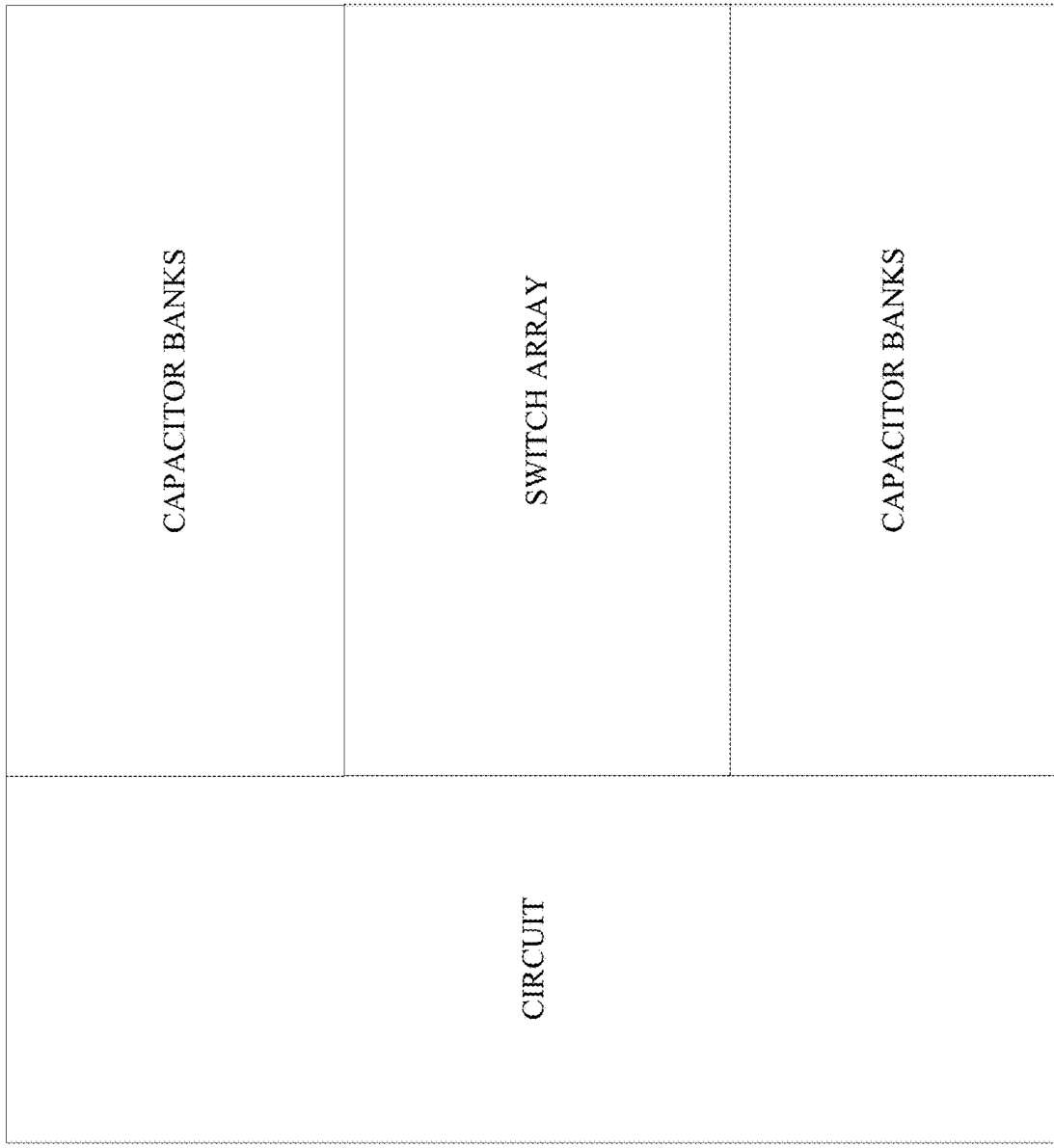
FIG. 11 is a block diagram of a SAR-ADC layout.
Figure 12:
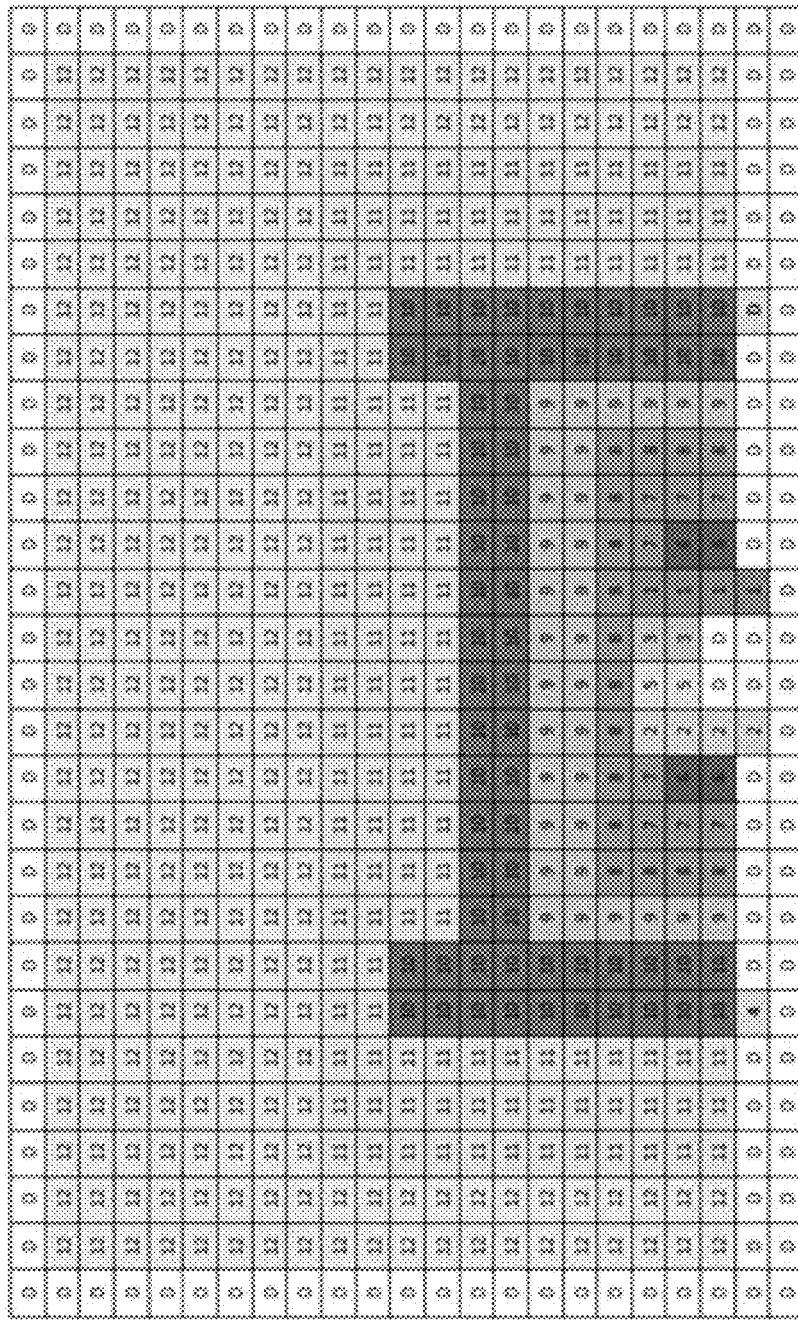
FIG. 12 is an example capacitor layout in a SAR-ADC.

FIG. 10 is a flowchart of an example technique 10000 for a N-bit SAR-based TDC in accordance with embodiments of this disclosure. The method 10000 includes: generating 10100 a delayed first input signal from a first input signal and a delayed second input signal from a second input signal; applying 10200 a gain value, by a first variable gain time difference amplifier, to a time difference between the delayed first input signal and the first input signal to generate an amplified delayed first input signal; applying 10300 a gain value, by a second variable gain time difference amplifier, to a time difference between the delayed second input signal and the second input signal to generate an amplified delayed second input signal; determining 10400 a bit value for a step based on which of the amplified delayed first input signal and the amplified delayed second input signal leads the other of the amplified delayed first input signal and the amplified delayed second input signal; setting 10500 another gain value, in the first variable gain time difference amplifier, based on the determined bit value in a previous step; setting 10600 another gain value, in the second variable gain time difference amplifier, based on the determined bit value in the previous step; repeating 10700 the generating, a first occurrence of the applying, a second occurrence of the applying, the determining, a first occurrence of the setting, and a second occurrence of the setting until N steps are complete; and outputting 10800 a digital result based on each determined bit value in the N steps. The method 10000 can be implemented by the SAR-based TDC 1000 of FIG. 1, the SDU 3000 of FIG. 3, the variable gain TDA 5000 of FIG. 5, the variable gain TDA 6000 of FIG. 6, the time latch 7000 of FIG. 7, and the SAR-based TDC 8000 of FIG. 8, as appropriate and applicable.

The method 10000 includes generating 10100 a delayed first input signal from a first input signal and a delayed second input signal from a second input signal. The first input signal and the second input signal are time domain signals or edges for which a phase difference measurement is to be made. In some implementations, the signal that is ahead, is a reference signal. The SAR-based TDC can quantize the time difference between the two time domain signals or edges in a N step conversion process. In the event that the SAR-based TDC is part of a SAR-ADC, the time domain signals or edges would be the output of a VTC, which takes in two voltages and converts them into the time domain. The SAR-based TDC quantizes the difference into the digital domain. The first input signal and the second input signal are both delayed by a unit delay, which represents the base delay value for the SAR-based TDC.

The method 10000 includes applying 10200 a gain value, by a first variable gain time difference amplifier, to a time difference between the delayed first input signal and the first input signal to generate an amplified delayed first input signal and applying 10300 a gain value, by a second variable gain time difference amplifier, to a time difference between the delayed second input signal and the second input signal to generate an amplified delayed second input signal. One of the first input signal and the second input signal is assumed or deemed to be ahead of the other. Each of the first variable gain time difference amplifier and the second variable gain time difference amplifier implement programmable binary weighted gains to implement a binary search to determine which signal is ahead at each step of the N step quantization or digitization. Each gain amplifies the unit delay or base delay value by a value of the gain. An FSM machine controls and sets the gain values in the first variable gain time difference amplifier and the second variable gain time difference amplifier. The signal that is ahead (or leading) is initially delayed by half the dynamic range, i.e., mid-scale delay generation. No delay or a gain of 0 is applied to the other signal.

The method 10000 includes determining 10400 a bit value for a step based on which of the amplified delayed first input signal and the amplified delayed second input signal leads the other of the amplified delayed first input signal and the amplified delayed second input signal. A phase comparator is used to determine which signal is ahead (or behind). In a first step of the conversion, this represents a MSB of a digital output of the SAR-based TDC. The output at each step is used to determine the digital output. This is the output of the SAR-based TDC.

The method 10000 includes setting 10500 another gain value, in the first variable gain time difference amplifier, based on the determined bit value in a previous step and setting 10600 another gain value, in the second variable gain time difference amplifier, based on the determined bit value in the previous step. A FSM then sets gain values for the first variable gain time difference amplifier and the second variable gain time difference amplifier based on the output of the phase comparator and which step of the N step conversion has been completed. In some implementations, a looping technique can be used to provide some of the binary weighted gains needed for the N-bit SAR-based TDC. This looping technique mitigates the non-linearity and circuit complexity issues associated with using M number of time latches to implement the first variable gain time difference amplifier and the second variable gain time difference amplifier. In some implementations, M is greater than 2 time latches. The FSM includes logic to determine if a looping technique is being employed. If the looping technique is being employed, the FSM foregoes setting the gain values until the SAR-based TDC completes the required number of loops in the step being processed.

The method 10000 includes repeating 10700 the generating, a first occurrence of the applying, a second occurrence of the applying, the determining, a first occurrence of the setting, and a second occurrence of the setting until N steps are complete and outputting 10800 a digital result based on each determined bit value in the N steps. For each step in the N step conversion, gain values are set (subject to looping as needed) and the remaining SAR-based TDC processing is performed. A digital output can be output in serial or parallel fashion, as appropriate.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A N-bit successive approximation register based time-to-digital converter comprising:
   a first delay circuit configured to delay a first input signal to generate a delayed first input signal;
   a second delay circuit configured to delay a second input signal to generate a delayed second input signal;
   a first programmable time difference amplifier configured to apply a gain value to the delay between the first input signal and the delayed first input signal to generate an amplified delayed first input signal, which is feedback to the first delay circuit and the first programmable time difference amplifier;
   a second programmable time difference amplifier configured to apply a gain value to the delay between the second input signal and the delayed second input signal to generate an amplified delayed second input signal, which is feedback to the second delay circuit and the second programmable time difference amplifier;
   a comparator configured to determine a bit value for a step in a N step conversion, the bit value based on which of the amplified delayed first input signal and the amplified delayed second input signal is in leading position; and
   a finite state machine configured to set another gain value, for a next step in the N step conversion, in the first programmable time difference amplifier based on the determined bit value in a previous step and set another gain value in the second programmable time difference amplifier based on the determined bit value in the previous step,
   wherein the N-bit successive approximation register based time-to-digital converter is configured to
      determine a bit value for each step in the N step conversion; and
      output a digital result based on each determined bit value in the N step conversion.

2. The circuit of claim 1, wherein the first input signal and the second input signal are time domain signals.

3. The circuit of claim 1, further comprising a voltage-to-time converter configured to convert a first voltage input signal and a second voltage input signal to the first input signal and the second input signal.

4. The circuit of claim 1, wherein each gain value in the first programmable time difference amplifier and each gain value in the second programmable time difference amplifier are binary weighted gain values.

5. The circuit of claim 1, wherein each gain value set for each step in the N step conversion for the first programmable time difference amplifier is different from each gain value set for each step in the N step conversion for the second programmable time difference amplifier.

6. The circuit of claim 1, the N-bit successive approximation register based time-to-digital converter configured to operate in a looping configuration, wherein multiple loops are made using a current gain value setting to meet a desired gain value in a step.

7. The circuit of claim 1, wherein the finite state machine is further configured to forego setting the another gain value in the first programmable time difference amplifier and the another gain value in the second programmable time difference amplifier until the N-bit successive approximation register based time-to-digital converter completes a defined number of loops to meet a desired gain value in a step.

8. The circuit of claim 1, wherein each of the first programmable time difference amplifier and the second programmable time difference amplifier further comprise a two-stage time latch.

9. The circuit of claim 1, wherein each of the first programmable time difference amplifier and the second programmable time difference amplifier further comprise
   a first time latch;
   a second time latch connected to the first time latch;
   a gain logic circuit connected to the first time latch and the second time latch; and
   a digital gain controller connected to the first time latch and the second time latch, wherein the digital gain controller is configured to configure the first time latch, the second time latch, and the gain logic circuit to generate an amplified delayed input signal based on control information received from the finite state machine.

10. The circuit of claim 9, wherein each of the first programmable time difference amplifier and the second programmable time difference amplifier further comprise a skew circuit configured to maintain a constant skew for each gain value.

11. A circuit comprising:
   a first variable gain time difference amplifier configured to apply a gain value to a time difference between a first signal edge and a first delayed signal edge to generate a first amplified time difference signal, which is feedback to the first variable gain time difference amplifier;
   a second variable gain time difference amplifier configured to apply a gain value to a time difference between a second signal edge and a second delayed signal edge to generate a second amplified time difference signal, which is feedback to the second variable gain time difference amplifier; and
   a finite state machine configured to set another gain value, for a next step in a N step conversion until N steps are completed, in the first variable gain time difference amplifier based on a bit value from a previous step and set another gain value in the second variable gain time difference amplifier based on the bit value from the previous step, wherein the bit value indicates, for a step in the N step conversion, which of the first amplified time difference signal and the second amplified time difference signal is ahead.

12. The circuit of claim 11, further comprising
a phase comparator configured to determine each bit value for each step in the N step conversion.

13. The circuit of claim 11, wherein each gain value in the first variable gain time difference amplifier and each gain value in the second variable gain time difference amplifier are binary weighted gain values.

14. The circuit of claim 11, wherein each gain value set for each step in the N step conversion for the first variable gain time difference amplifier is different from each gain value set for each step in the N step conversion for the second variable gain time difference amplifier.

15. The circuit of claim 11, wherein the finite state machine is further configured to forego setting the another gain value in the first variable gain time difference amplifier and the another gain value in the second variable gain time difference amplifier until a defined number of loops is completed to meet a desired gain value in a step.

16. The circuit of claim 11, wherein each of the first variable gain time difference amplifier and the second variable gain time difference amplifier further comprise a two-stage time latch.

17. The circuit of claim 11, wherein each of the first variable gain time difference amplifier and the second variable gain time difference amplifier further comprise
a first time latch;
a second time latch connected to the first time latch;
a gain logic circuit connected to the first time latch and the second time latch; and
a digital gain controller connected to the first time latch and the second time latch, the digital gain controller configured to configure the first time latch, the second time latch, and the gain logic circuit to generate a desired gain value and an amplified time difference signal based on control information received from the finite state machine.

18. The circuit of claim 17, wherein each of the first variable gain time difference amplifier and the second variable gain time difference amplifier further comprise
a skew logic circuit configured to maintain a constant skew for each desired gain value.

19. A method comprising:
applying, by a first variable gain time difference amplifier, a gain value to a time difference between a first signal edge and a first delayed signal edge to generate a first amplified time difference signal, which is feedback to the first variable gain time difference amplifier;
applying, by a second variable gain time difference amplifier, a gain value to a time difference between a second signal edge and a second delayed signal edge to generate a second amplified time difference signal, which is feedback to the second variable gain time difference amplifier; and
setting, by a finite state machine, another gain value, for a next step in a N step conversion until N steps are completed, in the first variable gain time difference amplifier based on a bit value from a previous step and another gain value in the second variable gain time difference amplifier based on the bit value from the previous step, wherein the bit value indicates, for a step in the N step conversion, which of the first amplified time difference signal and the second amplified time difference signal is ahead.

20. The method of claim 19, the method further comprising
foregoing, by the finite state machine, the setting until a defined number of loops is completed to meet a desired gain value in a step.

* * * * *